US008996785B2

(12) United States Patent
Lee et al.

(10) Patent No.: US 8,996,785 B2
(45) Date of Patent: *Mar. 31, 2015

(54) NAND-BASED HYBRID NVM DESIGN THAT INTEGRATES NAND AND NOR IN 1-DIE WITH SERIAL INTERFACE

(75) Inventors: Peter W. Lee, Saratoga, CA (US); Fu-Chang Hsu, San Jose, CA (US); Kesheng Wang, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 1193 days.

This patent is subject to a terminal disclaimer.

(21) Appl. No.: 12/807,997

(22) Filed: Sep. 17, 2010

(65) Prior Publication Data

US 2011/0072201 A1 Mar. 24, 2011

Related U.S. Application Data

(60) Provisional application No. 61/277,207, filed on Sep. 21, 2009.

(51) Int. Cl.
G06F 12/00 (2006.01)
G11C 16/32 (2006.01)
G11C 16/04 (2006.01)

(52) U.S. Cl.
CPC ............ *G11C 16/32* (2013.01); *G11C 16/0408* (2013.01)
USPC .................... 711/103; 711/114; 711/E12.001

(58) Field of Classification Search
USPC .................................................. 711/103, 114
See application file for complete search history.

(56) References Cited

U.S. PATENT DOCUMENTS

| 5,603,001 | A | * | 2/1997 | Sukegawa et al. | ............ 711/103 |
|---|---|---|---|---|---|
| 5,966,723 | A | * | 10/1999 | James et al. | ................ 711/103 |
| 6,122,704 | A | | 9/2000 | Hass et al. | |
| 6,687,154 | B2 | | 2/2004 | Lee et al. | |
| 6,862,223 | B1 | | 3/2005 | Lee et al. | |
| 7,064,978 | B2 | | 6/2006 | Lee et al. | |
| 7,075,826 | B2 | | 7/2006 | Lee et al. | |
| 7,102,929 | B2 | | 9/2006 | Lee et al. | |
| 7,110,302 | B2 | | 9/2006 | Lee et al. | |

(Continued)

OTHER PUBLICATIONS

International Search Report PCT/US 10/02554 Mail date—Nov. 10, 2010.

(Continued)

*Primary Examiner* — Larry Mackall
(74) *Attorney, Agent, or Firm* — Saile Ackerman LLC; Stephen B. Ackerman; Billy Knowles

(57) ABSTRACT

A nonvolatile memory device includes multiple independent nonvolatile memory arrays that concurrently for parallel reading and writing the nonvolatile memory arrays. A serial interface communicates commands, address, device status, and data between a master device and nonvolatile memory arrays for concurrently reading and writing of the nonvolatile memory arrays and sub-arrays. Data is transferred on the serial interface at the rising edge and the falling edge of the synchronizing clock. The serial interface transmits a command code and an address code from a master device and transfers a data code between the master device and the nonvolatile memory device, wherein the data code has a length that is determined by the command code and a location determined by the address code. Reading one nonvolatile memory array may be interrupted for reading another. One reading operation has two sub-addresses with one transferred prior to a command.

10 Claims, 25 Drawing Sheets

(56) References Cited

U.S. PATENT DOCUMENTS

| | | |
|---|---|---|
| 7,120,064 B2 | 10/2006 | Lee et al. |
| 7,283,401 B2 | 10/2007 | Lee et al. |
| 7,289,366 B2 | 10/2007 | Lee et al. |
| 7,318,115 B2 | 1/2008 | Kanapathippillai et al. |
| 7,324,384 B2 | 1/2008 | Lee et al. |
| 7,369,438 B2 | 5/2008 | Lee |
| 7,372,736 B2 | 5/2008 | Lee et al. |
| 7,636,252 B2 | 12/2009 | Lee et al. |
| 2003/0196059 A1* | 10/2003 | Satagopan et al. ............ 711/169 |
| 2005/0015539 A1 | 1/2005 | Horii et al. |
| 2005/0172067 A1* | 8/2005 | Sinclair ........................ 711/103 |
| 2006/0176738 A1 | 8/2006 | Lee et al. |
| 2006/0271727 A1* | 11/2006 | Wang et al. .................. 711/103 |
| 2008/0022396 A1* | 1/2008 | Kado .............................. 726/19 |
| 2008/0049505 A1 | 2/2008 | Kim et al. |
| 2008/0096327 A1 | 4/2008 | Lee et al. |
| 2009/0067240 A1* | 3/2009 | Roohparvar et al. .... 365/185.03 |
| 2009/0196102 A1 | 8/2009 | Kim |

OTHER PUBLICATIONS

Co-pending U.S. Appl. No. 12/807,080, filed Aug. 27, 2010, "A Novel NAND-Based Hybrid NVM Design that Integrates NAND and NOR in 1-Die with Serial Interface," assigned to the same assigness as the present invention.

* cited by examiner

| SYMBOL | TYPE | DESCRIPTION |
|---|---|---|
| SCK | INPUT | TO PROVIDE THE TIMING OF THE SERIAL INTERFACE. COMMANDS, ADDRESSES, OR INPUT DATA ARE LATCHED ON THE RISING EDGE OF THE CLOCK INPUT, WHILE OUTPUT DATA IS SHIFTED OUT ON THE FALLING EDGE OF THE CLOCK INPUT. (DURING THE SPECIAL READ MODE, THE OUTPUT DATA IS SHIFTED OUT ON THE FALLING AND RISING EDGE OF THE CLOCK INPUT) |
| CE# | INPUT | THE DEVICE IS ENABLED BY A HIGH TO LOW TRANSISTION ON CE#. CE# MUST REMAIN LOW FOR THE DURATION OF ANY COMMAND SEQUENCE; OR IN THE CASE OF WRITE OPERATIONS, FOR THE COMMAND/DATA INPUT SEQUENCE. |
| SIO [N:0] | INPUT/ OUTPUT | TO TRANSFER COMMANDS, ADDRESSES, OR DATA SERIALLY INTO THE DEVICE OR DATA OUT OF THE DEVICE, INPUTS ARE LATCHED ON THE RISING EDGE OF THE SERIAL CLOCK. DATA IS SHIFTED OUT ON THE FALLING EDGE OF THE SERIAL CLOCK. (DURING THE SPECIAL READ MODE, THE OUTPUT DATA IS SHIFTED OUT ON THE FALLING AND RISING EDGE OF THE CLOCK INPUT) |
| VDD | SUPPLY | DEVICE POWER SUPPLY |
| VSS | SUPPLY | GROUND |

*FIG. 1b*

| Operational Mode | Command Input | DQ[15:0] | Figs. for Operation |
|---|---|---|---|
| Rd NOR While NOR Wrt | NOR Rd Cmd | Output NOR data | Fig. 8 or Fig. 9 followed by Fig. 5b |
| Rd NOR While NAND Wrt | NOR Rd Cmd | Output NOR data | Fig. 8 or Fig. 9 followed by Fig. 5b |
| Rd NOR While NAND & NOR Wrt | NOR Rd Cmd | Output NOR data | 2 successive Fig. 8 or Fig. 9 followed by Fig. 5b |
| Rd NOR While NAND Rd | NOR Rd Cmd | Switch from output NAND data to Output NOR data | Fig. 6b or Fig. 7b |
| Rd NOR While Others Idle | NOR Rd Cmd | Output NOR data | Fig. 5b |
| Wrt NOR While NOR Rd | NOR Wrt Cmd | Output NOR data | Fig. 11b with Fig. 5b during dummy cycle |
| Wrt NOR While NAND Rd | NOR Wrt Cmd | Don't care | Fig. 11b with Fig. 5b during dummy cycle |
| Wrt NOR While NAND Wrt | NOR Wrt Cmd | Don't care | Fig. 8 or Fig. 9 (NAND) followed by Fig. 9 or Fig. 9 (NOR) |
| Wrt NOR While Others Idle | NOR Wrt Cmd | Don't care | Fig. 8 or Fig. 9 |

FIG. 14a

| Operational Mode | Command Input | DQ[15:0] | Figs. for Operation |
|---|---|---|---|
| Rd NAND While NAND Wrt | NAND Rd Cmd | Output NAND data | Fig. 8/Fig. 9 (ANAMD) followed by Fig. 5b (NAND) |
| Rd NAND While NOR Wrt | NAND Rd Cmd | Output NAND data | Fig. 8/Fig. 9 (NOR) followed by Fig. 5b (NAND) |
| Rd NAND While NAND & NOR Wrt | NAND Rd Cmd | Output NAND data | 2 successive Fig. 8/ Fig. 9 followed by Fig. 5b |
| Rd NAND While NOR Rd | NAND Rd Cmd | Switch from output NOR data to Output NAND data | Fig. 6b/Fig. 7b |
| Rd NAND While Others Idle | NAND Rd Cmd | Output NAND data | Fig. 5b |
| Wrt NAND While NAND Rd | NAND Wrt Cmd | Output NAND data | Fig. 11b with Fig. 8/Fig. 9 during dummy cycle |
| Wrt NAND While NOR Rd | NAND Wrt Cmd | Don't care | Fig. 11b with Fig. 8/Fig. 9 during dummy cycle |
| Wrt NAND While NOR Wrt | NAND Wrt Cmd | Don't care | Fig. 8/Fig. 9 (NAND) followed by Fig. 8/Fig. 9 (NOR) |
| Wrt NAND While Others Idle | NAND Wrt Cmd | Don't care | Fig. 8/Fig. 9 |

FIG. 14b

| Operational Mode | Command Input | DQ[15:0] | Figs. for Operation |
|---|---|---|---|
| Read Status Register | NAND/NOR Rd Cmd | Output NAND/NOR Data | Fig. 10 |
| Read Resume | NAND/NOR Rd Cmd - Other Op Cmd Dependent | Output NAND/NOR for Resume - "Other Operation COmmand Dependent | Fig. 11b |
| Read Jump | NAND/NOR Rd Cmd Interrupt w/ NAND/NOR Rd Cmd No Resume | Output 1st NAND/NOR Data then Jump to 2nd NAND/NOR Data | Fig. 12b |
| Address Ahead Input Read | NAND/NOR Read w/ Discrete Row Address & Column Address | Output: NAND/NOR Data | Fig. 13b |

FIG. 14C

NAND-BASED HYBRID NVM DESIGN THAT INTEGRATES NAND AND NOR IN 1-DIE WITH SERIAL INTERFACE

RELATED PATENT APPLICATIONS

This application claims priority under 35 U.S.C. §119 to U.S. Provisional Patent Application Ser. No. 61/277,207, filed on Sep. 21, 2009, which is herein incorporated by reference in its entirety.

U.S. patent application Ser. No. 12/807,080, filed on Aug. 27, 2010, assigned to the same assignee as the present invention, and incorporated herein by reference in its entirety.

BACKGROUND OF THE INVENTION

1. Field of the Invention

This invention relates generally to a nonvolatile memory devices. More particularly this invention relates to circuits and methods for executing protocols for communicating between nonvolatile memory arrays and external systems. Even more particularly, this invention relates to circuits and methods for controlling operation of multiple NAND and NOR flash memory arrays and communicating between the NAND and NOR flash memory arrays and external control systems.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin to double the address space. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production at the present time use one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memories provide the advantage of in-system program and erase capabilities and have a specification for providing at least 100K endurance cycles. In addition, both single-chip NAND and NOR flash nonvolatile memory products can provide giga-byte density because their highly-scalable cell sizes. For instance, presently a one-bit/one transistor NAND cell size is kept at $\sim 4\lambda^2$ ($\lambda$ being a minimum feature size in a semiconductor process), while NOR cell size is $\sim 10\lambda^2$. Furthermore, in addition to storing data as a single-level program cell having two voltage thresholds (Vt0 and Vt1), both one transistor NAND and NOR flash nonvolatile memory cells are capable of storing at least two bits per cell or two bits/one transistor with four multi-level threshold voltages (Vt0, Vt1, Vt2 and Vt03) in one physical cell. The multi-level threshold voltage programming of the one transistor NAND and NOR flash nonvolatile memory cells is referred to as multiple level programmed cells (MLC).

Currently, the highest-density of a single-chip double polycrystalline silicon gate NAND flash nonvolatile memory chip is 64 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) injection programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

The current consumer portable application requires a high speed, high density, and low cost NVM memory solution. The Serial Peripheral Interface has been widely used in serial flash nonvolatile memory devices. The Serial Peripheral Interface Bus or SPI bus is a synchronous serial data link protocol from Freescale Semiconductor Inc., Austin, Tex. 78735 (formally Motorola Inc.). The SPI bus operates in full duplex mode where devices communicate in master/slave mode and the master device initiates the data frame. A single Master device and multiple slave devices are allowed with individual slave select (chip select) lines. The SPI bus specifies four logic signals—SCLK—Serial Clock (output from master); MOSI/SIMO—Master Output; Slave Input (output from master); MISO/SOMI—Master Input, Slave Output (output from slave); and SS—Slave Select (active low; output from master).

The SPI bus has some of the following disadvantages: 1. SPI has no in-band addressing (multiple slave devices on a shared bus must have separate select lines or out-of-band chip select signals to address separate slaves shared buses). 2. SPI supports only one master device. 3. Without a formal standard, validating conformance is not possible.

The Serial Quad I/O™ (SQI™) is a 4-bit multiplexed I/O serial interface from Silicon Storage Technology, Inc., Sunnyvale, Calif. 94086. The SQI Interface provides Nibble-wide (4-bit) multiplexed I/O's with an SPI-like serial command structure and operation. The SQI bus consists of a Serial Clock (SCK) to provide the timing of the serial interface. Commands, addresses, or input data are latched on the rising edge of the clock input, while output data is shifted out on the falling edge of the clock input. The Serial Data Input/Output (SIO[3:0]) transfers commands, addresses, or data serially into a device or data out of a device. Inputs are latched on the rising edge of the serial clock. Data is shifted out on the falling edge of the serial clock. Chip Enable CE# provides enables a device by a high to low transition. The Chip Enable must remain low for the duration of any command sequence; or in the case of Write operations, for the command/data input sequence. Rather than the full-duplexed operation with the MOSI/SIMO—Master Output; Slave Input (output from master) and MISO/SOMI—Master Input, Slave Output (output from slave) of the SPI interface, the SQI functions as a half-duplex with the command, address, and data signals being transferred from the master to the slave and the Serial Data Input/Output bus reversing direction to have data and status being transferred from the slave to the master. With an 80 Mhz system clock rate, the maximum sustained data transfer rate is 320 Mbit/sec. The demand for future applications is for a maximum sustained data transfer rate of more than 1 Gbit/sec.

SUMMARY OF THE INVENTION

An object of this invention is to provide a nonvolatile memory device having multiple independent nonvolatile memory arrays.

Further, another object of this invention is to provide a nonvolatile memory device wherein multiple independent nonvolatile memory arrays function concurrently for parallel reading and writing of the multiple independent nonvolatile memory arrays.

Still further, another object of this invention is to provide a nonvolatile memory device with a serial interface for communication of commands, address, device status, and data between a master external control device and a slave nonvolatile memory device connected to the serial interface.

Further, another object of this invention is to provide a nonvolatile memory device in which commands from an external control device interrupts a process and restarts the process at another location within the nonvolatile memory device.

Still further, another object of this invention is to provide a nonvolatile memory device in which commands from an external control device provides a decoded address location within the nonvolatile memory device at which a process is to be executed.

To accomplish at least one of these objects, an embodiment of a nonvolatile memory device includes multiple nonvolatile memory arrays. Each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array. The nonvolatile memory device further includes a serial communication interface circuit for communication with an external control device.

The interface communication circuit receives a master clock signal, a chip enable signal, and a serial data bus. The interface communication circuit uses the master clock signal for capturing of the control signals received from the serial data bus. The interface communication circuit decodes the control signals to activate the nonvolatile memory device and to determine the commands to be executed by the nonvolatile memory device. The decoded commands are transmitted to the control circuitry within the multiple nonvolatile memory arrays for execution of the commands. The interface communication circuit further receives the data signals from the serial bus for distribution to selected locations within the nonvolatile memory arrays.

The nonvolatile memory device has an address decoder circuit connected to the serial bus to receive the address signal designating the location of the data to be read or written to selected locations within the nonvolatile memory arrays. The nonvolatile memory device has a data multiplexer connected to the nonvolatile memory arrays for receiving data signals read from selected locations of the nonvolatile memory array. The data multiplexer serializes the data signals that are concurrently read from selected nonvolatile memory arrays and transmits the data signals on the serial bus.

In some embodiments, the control signals received by the interface communication circuit commands that a read operation at one location be interrupted and the read operation be relocated to a second address. The second address is decoded by the address decoder and the data of the second location is transferred subsequent to the data from the first location.

In various embodiments, the control signals received by the interface communication circuit commands that a read operation be executed wherein two separate addresses are received and decoded separately to define a row address and a column address within one of the multiple nonvolatile memory arrays. One address of the two separate addresses defining the row address is transferred directly to a row latching drive and the other address of the two separate addresses defining the column address is transferred to a column latching driver of the selected one of the multiple nonvolatile memory arrays. The data located at the location designated by the two separate addresses is transferred to the serial data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the serial bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

In other embodiments, an electronic device has a host processing circuit in communication with a host master controller. The host master controller is communication with at least one slave nonvolatile memory device through a serial communication interface circuit within the slave nonvolatile memory device. The host master controller provides commands, address, and writes data to the slave device and receives read data and device status from the slave device.

The slave nonvolatile memory device includes multiple nonvolatile memory arrays. Each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

The interface communication circuit receives a master clock signal, a chip enable signal, and a serial data bus. The interface communication circuit uses the master clock signal for capturing of the control signals received from the serial data bus. The interface communication circuit decodes the control signals to activate the nonvolatile memory device and to determine the commands to be executed by the nonvolatile memory device. The decoded commands are transmitted to the control circuitry within the multiple nonvolatile memory arrays for execution of the commands. The interface communication circuit further receives the data signals from the serial bus for distribution to selected locations within the nonvolatile memory arrays.

The slave nonvolatile memory device has an address decoder circuit connected to the serial bus to receive the address signal designating the location of the data to be read or written to selected locations within the nonvolatile memory arrays. The slave nonvolatile memory device has a data multiplexer connected to the nonvolatile memory arrays for receiving data signals read from selected locations of the nonvolatile memory array. The data multiplexer serializes the data signals that are concurrently read from selected nonvolatile memory arrays and transmits the data signals on the serial bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the serial bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

In still other embodiments, a method for communicating commands, address, and write data to slave nonvolatile memory devices and for receiving read data and device status from the slave nonvolatile memory devices. The slave nonvolatile memory devices are provided such that each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

A master clock signal, a chip enable signal, and a serial data signal are received by the slave nonvolatile memory device from a serial data bus. The master clock signal captures the control signals received from the serial data bus. The control signals are decoded to activate the nonvolatile memory device and to determine the commands to be executed by the nonvolatile memory device. The decoded commands are transmitted for execution by the multiple nonvolatile memory arrays. The data signals are received from the serial bus for distribution to selected locations within the nonvolatile memory arrays identified by the address signals.

The address signal designating the location of the data to be read or written to selected locations within the nonvolatile memory arrays are read from the serial bus is received and decoded. Data signals concurrently read from selected locations of the nonvolatile memory array are serialized and transmitted the data signals on the serial bus.

In some embodiments, the control signals indicate that a read operation at one location is to be interrupted and the read operation is to be relocated to a second address. The second address is decoded and the data of the second location is transferred subsequent to the data from the first location.

In various embodiments, the control signals indicates that a read operation is to be executed wherein two separate addresses are received and decoded separately to define a row address and a column address within one of the multiple nonvolatile memory arrays. One address of the two separate addresses defining the row address is transferred directly to a row latching driver and the other address of the two separate addresses defining the column address is transferred to a column latching driver of the selected one of the multiple nonvolatile memory arrays. The data located at the location designated by the two separate addresses is transferred to the serial data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the serial bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

BRIEF DESCRIPTION OF THE DRAWINGS

FIG. 1b is a table describing the terminals of the serial communication interface of the nonvolatile memory device embodying the principles of this invention.

FIGS. 14a, 14b, and 14c are a table of the operational modes of the nonvolatile memory device embodying the principles of this invention.

DETAILED DESCRIPTION OF THE INVENTION

Figure 1A:
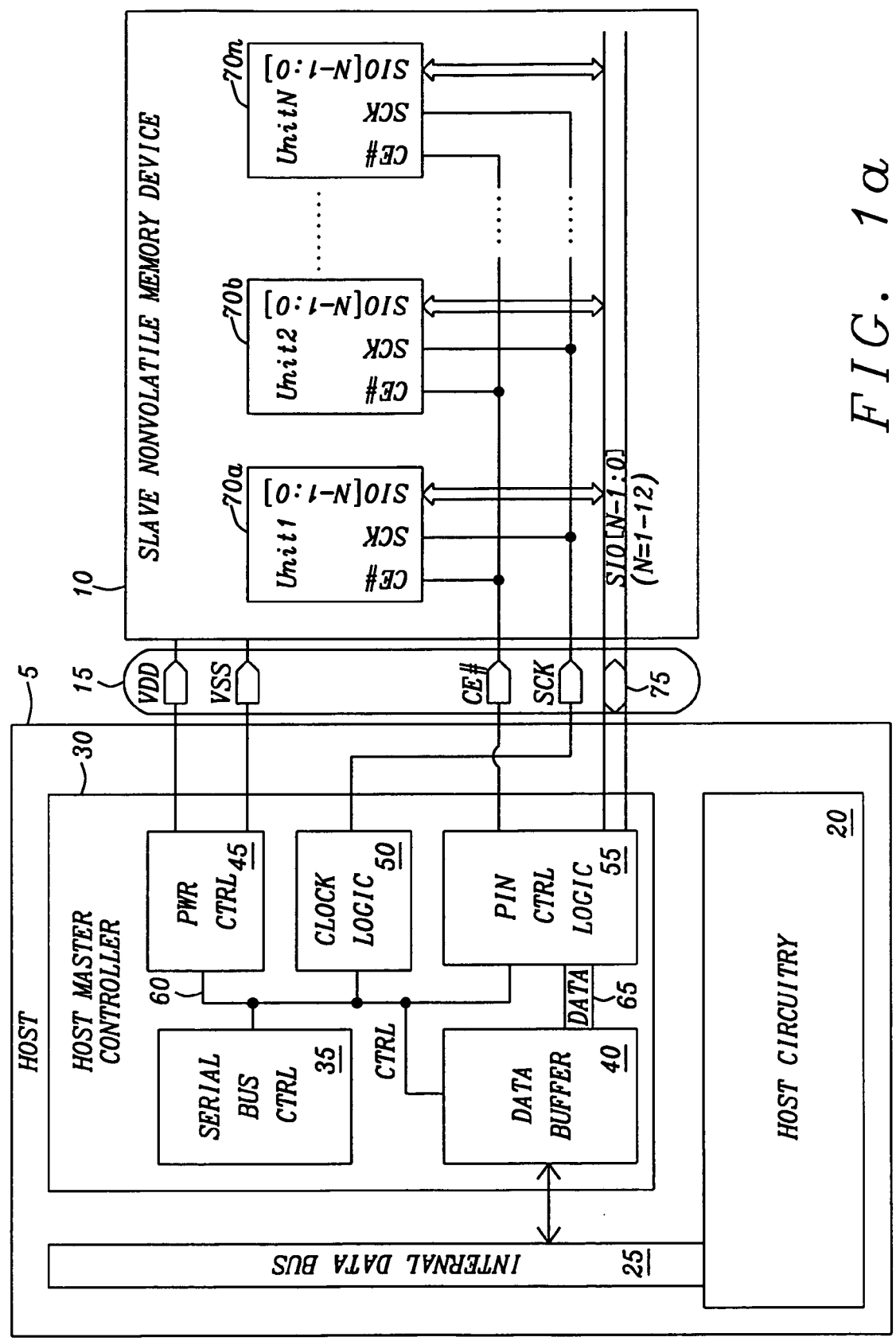
FIG. 1a is a block diagram illustrating an electronic device in communication with at least one slave nonvolatile memory device through a serial communication interface with the slave nonvolatile memory device embodying the principles of this invention.

A number patents and patent application publications for hybrid NAND and NOR nonvolatile memory arrays that are integrated in one die with a parallel interface are found in the art and are illustrated by the following: U.S. Pat. No. 7,120,064, U.S. Pat. No. 7,102,929, U.S. Pat. No. 7,372,736, U.S. Patent Application Publication 20080096327, U.S. Pat. No. 7,064,978, U.S. Pat. No. 7,324,384, U.S. Pat. No. 6,687,154, U.S. Pat. No. 7,283,401, U.S. Patent Application Publication 20060176738, U.S. Pat. No. 7,110,302, U.S. Patent Application Publication 20080247230, U.S. Pat. No. 7,075,826, U.S. Pat. No. 7,369,438, U.S. Pat. No. 6,862,223, U.S. Pat. No. 7,289,366 all to Lee, et al. and assigned to the same assignee as the present invention The disadvantage of parallel interfaces is the increase in the number of external pins of the die or package. The number of Input/Output pins for the die or page directly impacts the size and cost of the die and package. The number Input/Output pins would not be a constant. The doubling of the density of the nonvolatile memory causes an increase in the number of pins for the die or package. This makes the circuit design difficult and is not forward and backward compatible with different nonvolatile memory densities.

In various embodiments, a serial nonvolatile memory interface bus provides for communication of commands, address, and write data to a slave nonvolatile memory device and receives read data and device status from the slave nonvolatile memory device to a master host device. The slave nonvolatile memory device has multiple nonvolatile memory arrays each with independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

The serial nonvolatile memory interface bus includes connections that provide a master clock signal, a chip enable signal, and a serial data signal to the slave nonvolatile memory device from a serial data bus transmitted from the master host device. The master clock signal captures the control signals received from the serial data bus. The control signals are decoded to activate the nonvolatile memory device and to determine the commands to be executed by the nonvolatile memory device. The decoded commands are transmitted for execution by the multiple nonvolatile memory arrays. The data signals are received from the serial bus for distribution to selected locations within the nonvolatile memory arrays.

The address signal designates the location of the data to be read or written to selected locations within the nonvolatile memory arrays from the serial bus is received and decoded. Data signals concurrently read from selected locations of the nonvolatile memory array are serialized and transmitted on the serial bus.

In some embodiments, the control signals received command that a read operation at one location is to be interrupted and the read operation is to be relocated to a second address. The second address is decoded and the data of the second location is transferred subsequent to the data from the first location.

In various embodiments, the control signals command that a read operation be executed wherein two separate addresses are received and decoded separately to define a row address and a column address within one of the multiple nonvolatile memory arrays. One address of the two separate addresses defining the row address is transferred directly to a row latching drive and the other address of the two separate addresses defining the column address is transferred to a column latching driver of the selected one of the multiple nonvolatile memory arrays. The data located at the location designated by the two separate addresses is transferred to the serial data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the serial bus while programming data to selected memory cells of the nonvolatile memory sub-array.

In various embodiments, the coding of the control signals define that some of the nonvolatile memory arrays are being read, other of the nonvolatile memory arrays are being written to and still other are being programmed.

FIG. 1a is a block diagram illustrating a host electronic device 5 in communication with at least one slave nonvolatile memory device 10 through a serial communication interface 15. The host electronic device 5 includes host circuitry 20 that may be a microprocessor, a microcontroller, digital signal processor, or other digital computation device. The host circuitry 20 is connected to an internal data bus 25 that provides the necessary signals for the communication of control signals, address signals, and data signals for the host circuitry 20 to communicate with peripheral devices (not shown) attached such that the host circuitry can execute its designed functions.

FIG. 1b is a table describing the terminals of the serial communication interface 15 of the nonvolatile memory device 10. Referring to FIGS. 1a and 1b, the clock signal SCK is an output of the host electronic device 5 and provides the timing for the serial interface. Commands, addresses, or input data transmitted on the serial interface Input/Output bus 75 are latched on the rising edge of the clock input by the nonvolatile memory device 10. The output data is shifted out on the serial interface Input/Output bus 75 at the falling edge of the clock signal SCK. During a special read mode, the output data is shifted out on serial interface Input/Output bus 75 at the falling and rising edge of the clock signal SCK.

A chip enable signal CE# is an input to the nonvolatile memory device 10 that activates the nonvolatile memory device 10 for an operation. The nonvolatile memory device 10 is enabled by a transition of the chip enable signal CE# from the high state (logical "1") to the low state (logical "0"). The chip enable signal CE# must remain low for the duration of any command sequence. In the case of Write operations (erase or program), the command sequence consists of the command, address, and any data input to be written. The command operations are terminated when the chip enable signal CE# transitions from the low state (logical "0") to the high state (logical "1").

The serial interface Input/Output bus 75 is a bi-directional interface transfer commands, addresses, or data serially into the nonvolatile memory device 10 data out from the nonvolatile memory device 10. Input command signals, address signals, and data signals are latched on the rising edge of the clock signal SCK. Output Data is shifted out on the falling edge of the serial clock, except during the special read mode, where the output data is shifted out on the falling and rising edge of the clock signal SCK.

The serial communication interface 15 has power supply terminals for the power supply voltage source VDD and the power supply reference level VSS. The power supply voltage source VDD terminals are connections for the nonvolatile memory device 10 to the power supply. The power supply reference level VSS terminals are the connections to the ground reference voltage level.

A host master controller 30 is connected to the internal data bus 25 to communicate with the host circuitry 20. The host master controller 30 receives the necessary command signals, address signals, and data signals from the host circuitry 20 and controls the generation of the necessary timing, command, control, and data signals that comply with the protocol of the serial communication interface 15. The serial bus controller interprets the command, control, and timing signals received from the internal data bus 25 to generate the necessary control signals 60. The data buffer 40 receives the data to be transmitted from the host circuitry 20 to the slave nonvolatile memory device 10 or from the slave nonvolatile memory device 10 to the host circuitry 20. The power control circuitry 45 is connected to receive the control signals 60 from the serial bus controller 35 provide and monitor the power supply voltage level VDD and the power supply reference level VSS.

The clock logic 50 is connected to receive the control signals 60 from the serial bus controller 35 to control the transmission of the clock signal SCK on the interface bus. The clock signal SCK has a frequency, in some embodiments, of approximately 80 Mhz. The pin control logic circuit 55 is connected to the data bus 65 to receive the data signals from or transfer data signals to the data buffer 40. The pin control logic circuit 55 is further connected to the control signals 60 to receive the necessary command and control signals from the serial bus controller 35 to format the command, control, and data signals for transmission to the serial interface Input/Output bus 75 for transfer to the slave nonvolatile memory device 10. The pin control logic circuit 55 receives data read from the slave nonvolatile memory device 10, formats the data to protocol of the host circuitry 20 and stores it to the data buffer 40. The pin control logic circuit 55 generates the chip enable signal CE# for transfer to the slave nonvolatile memory device 10 to inform the slave nonvolatile memory device 10 that the command, control, and data signal are active and should be received and processed.

Figure 2:
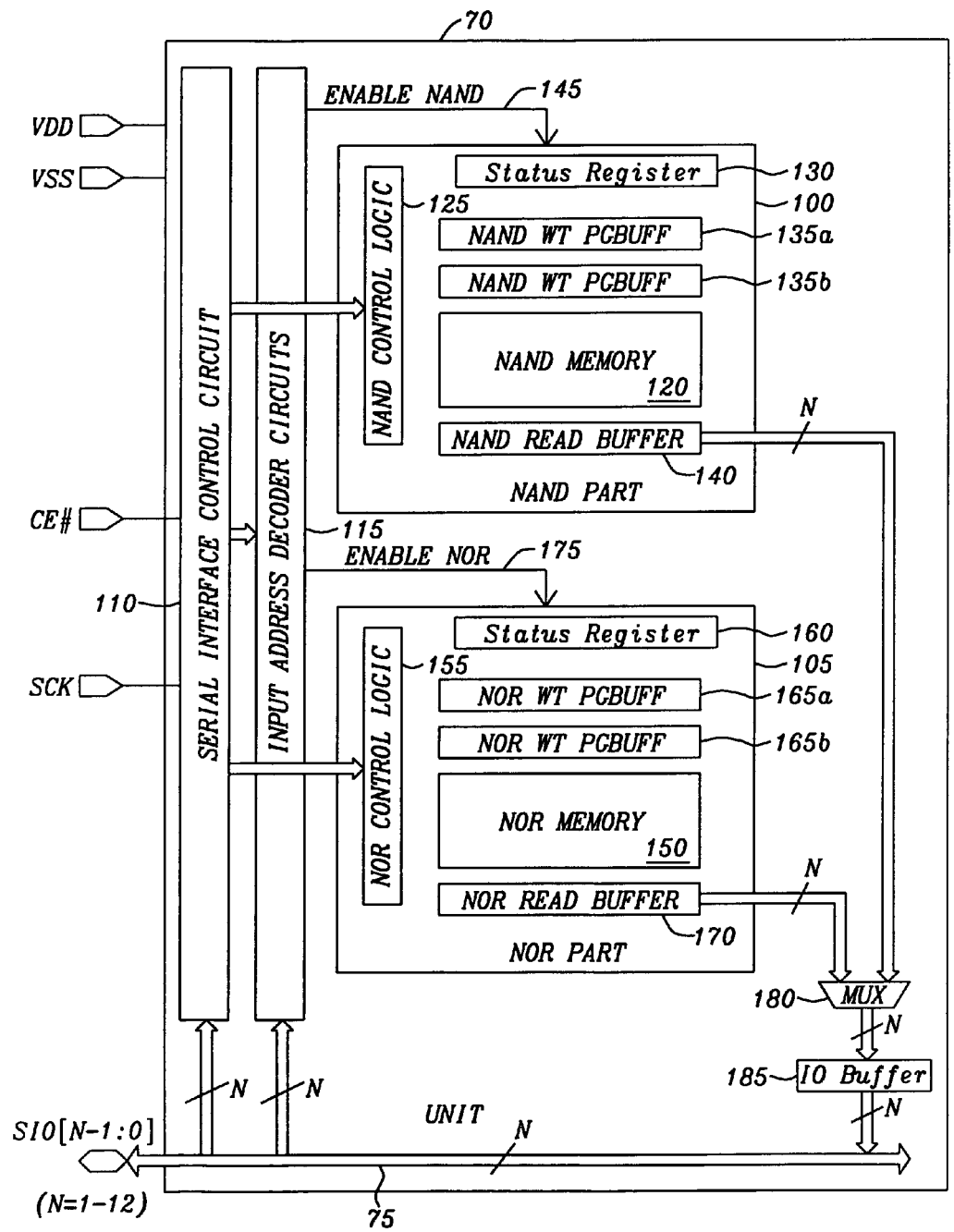
FIG. 2 is a block diagram illustrating a nonvolatile memory device communicating with an external device through a serial communication interface embodying the principles of this invention.

The slave nonvolatile memory device 10 includes multiple nonvolatile memory units 70a, 70b, . . . 70n. Each of the multiple nonvolatile memory units 70a, 70b, . . . 70n is connected to receive the power supply voltage level VDD and the power supply reference level VSS, the clock signal SCK, the chip enable signal CE#, and the Input/Output bus 75 from the serial communication interface 15. FIG. 2 is a block diagram illustrating a slave nonvolatile memory device 10 communicating with the external control device of the host 5 through the serial communication interface 15. Referring to FIG. 2, the nonvolatile memory unit 70 has at least two nonvolatile memory array elements—a NAND memory array element 100 and a NOR memory array element 105 for retaining the data transferred from the host electronic device 5 of FIG. 1. The power supply voltage level VDD and the power supply reference level VSS are transferred to the nonvolatile memory unit 70. The chip enable signal CE# and the clock signal SCK are applied to the serial interface control circuit 110.

The serial interface control circuit 110 is connected to serial interface Input/Output bus 75 to receive the command, address, and data. The command and address are decoded for transfer to the NAND memory array element 100 and a NOR memory array element 105 for reading and writing data. The chip enable signal CE# provides the trigger for beginning of the capture of the command, address, and data from the serial interface Input/Output bus 75 by the by the serial interface control circuit 110 at the rising edge and falling edge of the clock signal SCK. The chip enable signal CE# and the clock signal SCK are further transferred to the input address decoder circuit 115. The input address decoder circuit 115 is similarly connected to the serial interface Input/Output bus 75 and receives the command and address at the activation of the chip enable signal CE#. The input address decoder circuit 115 decodes the address and determines which of the NAND memory array element 100 and a NOR memory array element 105 is to be selected for reading and/or writing of data. Upon selection of desired NAND memory array element 100 and/or a NOR memory array element 105, the input address decoder circuit 115 activates the NAND element enable signal 145 and/or the NOR element enable signal 175 to alert the NAND memory array element 100 and/or a NOR memory array element 105 that data is to be read and/or written.

The NAND memory array element 100 has a NAND logic control circuit 125 that receives the command, address and data from the serial interface control circuit 110. The NAND logic control circuit 125 further decodes the address and based on the command establishes the necessary read, program, or erase biasing voltages that are applied to the NAND memory array 120. The data is written from the NAND logic control circuit 125 to one of the NAND write page buffers 135a or 135b and from the page buffers the data is then programmed to the NAND memory array 120. The dual write page buffers 135a or 135b enables execution of a data write to one of the write page buffers 135a or 135b while the data is programmed from the other write page buffers 135a or 135b. The concurrent write while program operation accelerates the overall performance of the writing of data to the NAND memory array element 100. For a read operation, the NAND logic control circuit 125 provides a read address to the NAND memory array 120 and the data is transferred from the addressed location to the NAND read page buffer 140. From the NAND read page buffer 140, the data is transferred through the multiplexer 180 to the Input/Output buffer 185 to the serial Input/Output bus 75.

The NOR memory array element 105 has a NOR logic control circuit 155 that receives the command, address and data from the serial interface control circuit 110. The NOR logic control circuit 155 further decodes the address and based on the command establishes the necessary read, program, or erase biasing voltages that are applied to the NOR memory array 150. The data is written from the NOR logic control circuit 155 to one of the NOR write page buffers 165a or 165b and from the page buffers the data is then programmed to the NOR memory array 120. The dual write page buffers 165a or 165b enables execution of a data write to one of the write page buffers 165a or 165b while the data is programmed from the other write page buffers 165a or 165b. The concurrent write while program operation accelerates the overall performance of the writing of data to the NOR memory array element 105. For a read operation, the NOR logic control circuit 155 provides a read address to the NOR memory array 150 and the data is transferred from the addressed location to the NOR read page buffer 170. From the NOR read page buffer 170, the data is transferred through the multiplexer 180 to the Input/Output buffer 185 to the serial Input/Output bus 75.

Figure 3A:
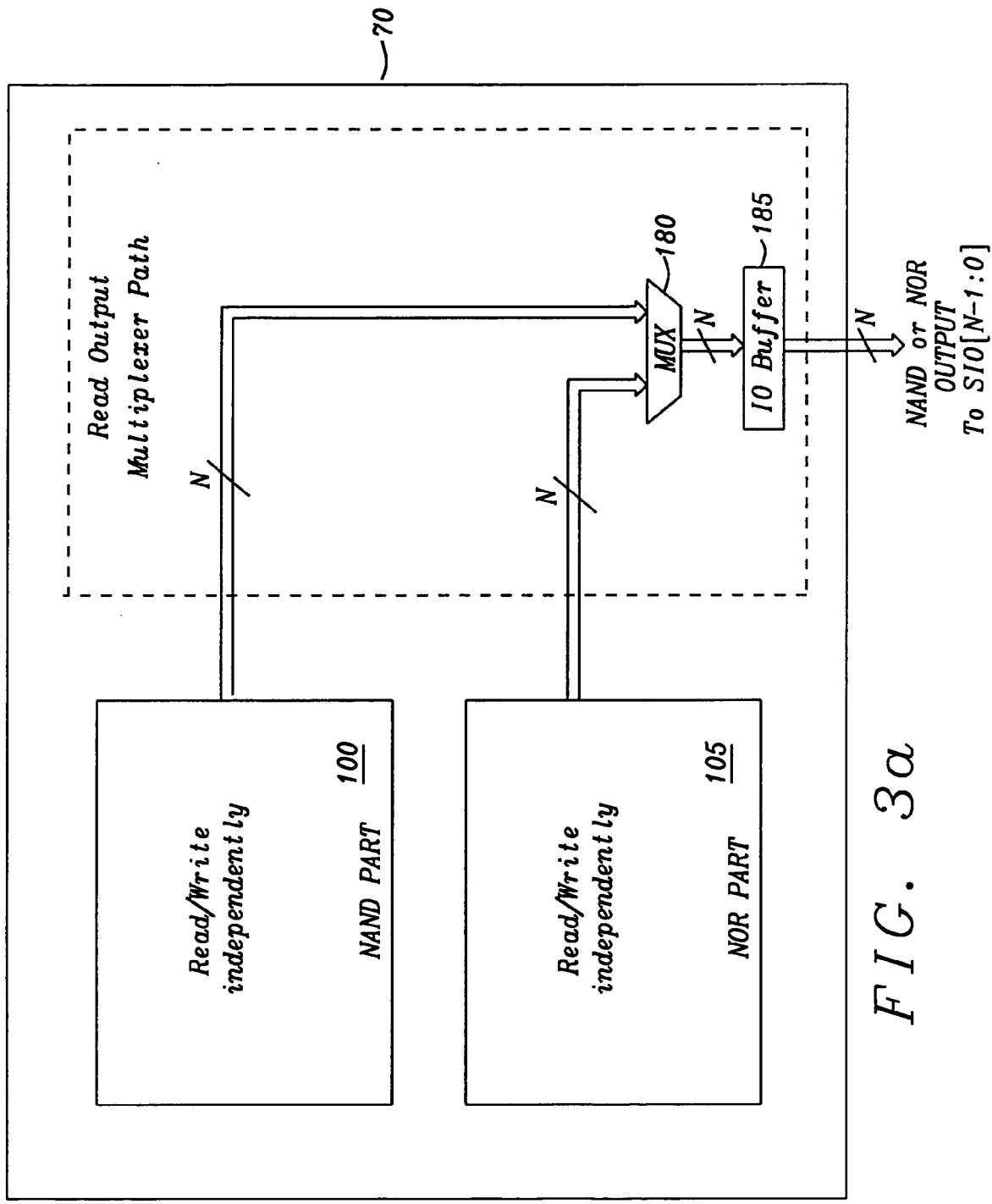
FIG. 3a is a block diagram of multiple independent nonvolatile memory arrays transferring data through a multiplexer to the serial communication interface of FIG. 2.

FIG. 3a is a block diagram of multiple independent nonvolatile memory array elements 100 and 105 transferring data through the multiplexer 180 to the Input/Output bus 75 of FIG. 2. Referring to FIG. 3a the NAND memory array element 100 and a NOR memory array element 105 are each executing separate read and/or write operations within each. If the operations are to be read operations, the NAND memory array element 100 and a NOR memory array element 105 each transfer their data output signals to the multiplexer 180. The serial interface control circuit 110 provides the necessary select control signals SEL to select appropriate output data signals from the NAND memory array element 100 or a NOR memory array element 105 for transfer to the Input/Output bus 75.

Figures 3B, 3C:
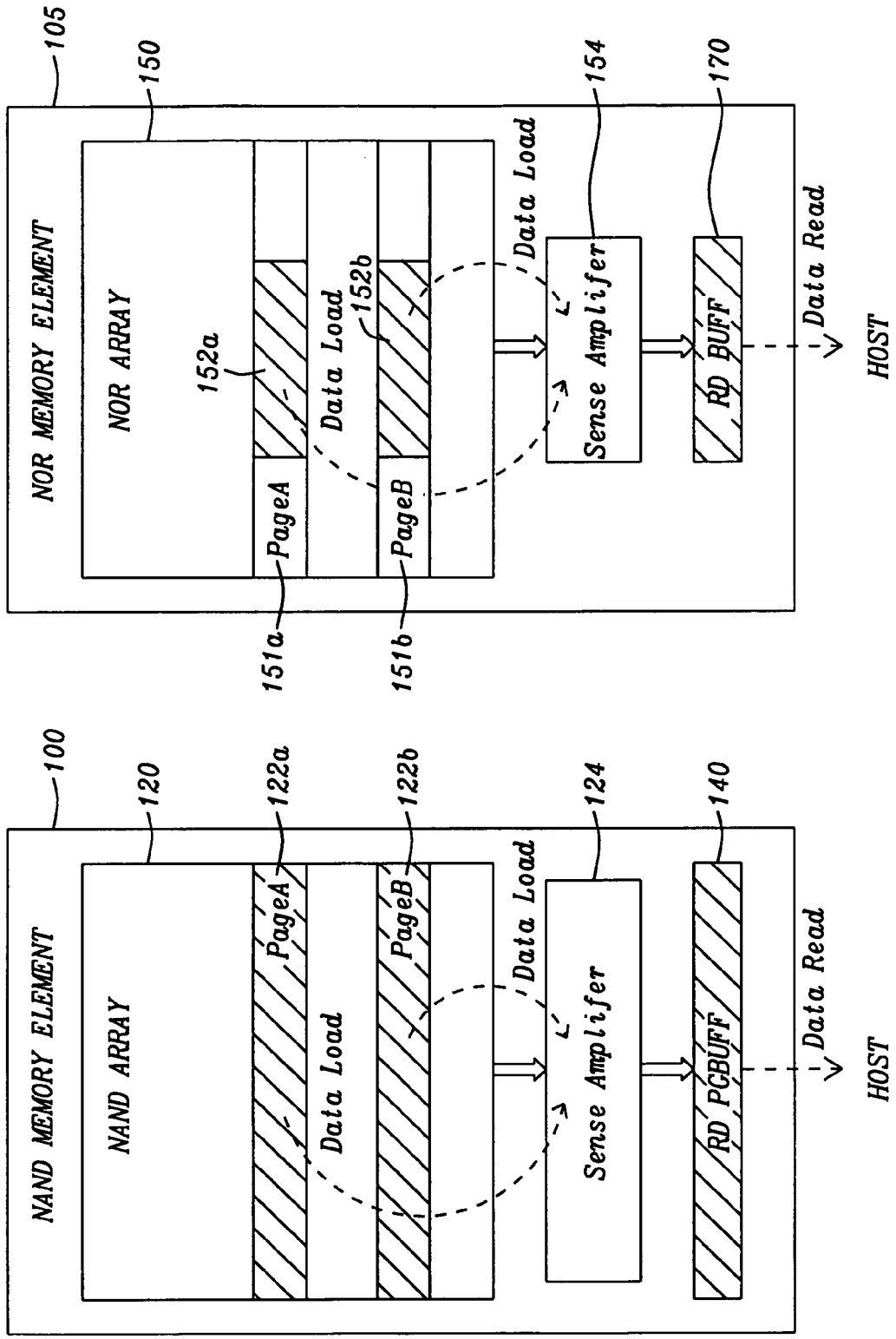
FIG. 3b is a block diagram illustrating a simultaneous read-while-loading of a NAND nonvolatile memory array embodying the principles of this invention.
FIG. 3c is a block diagram illustrating a simultaneous read-while-loading of a NOR nonvolatile memory array embodying the principles of this invention.

FIG. 3b is a block diagram illustrating a simultaneous read-while-loading of a NAND nonvolatile memory array element 100. The simultaneous read-while-loading operation accelerates the read performance of the NAND nonvolatile memory array element 100 enabling data to be read out to the host electronic device 5 from the NAND read page buffer 140 while the data is being loaded from the NAND memory array 120 and determined by the sense amplifier 124. Once the data is determined by the sense amplifier 124, it is transferred to the NAND read page buffer 140 in parallel and instantly. There are multiple individual sense amplifier circuits within the sense amplifier 124 for the NAND memory array 120 such that the data from a selected page 122a is read in parallel. Upon completion of the parallel sensing by the sense amplifier 124, the data is then transferred in parallel to the NAND read page buffer 140 and read out from the NAND read page buffer 140 to the serial interface Input/Output bus 75 and thus to the host electronic device 5. Concurrently, the next page 122b is selected and the data is sensed by the sense amplifier 124. Upon completion of the sensing by the sense amplifier 124, the data of the page 122b is then transferred to the NAND read page buffer 140 and read out from the NAND read page buffer 140 to the serial interface Input/Output bus 75 and thus to the host electronic device 5. This structure allows for simultaneous sensing of data from a page 122b by the sense amplifier 124 and transfer of the data from a previously sensed page 122a from the NAND read page buffer 140 to the serial interface Input/Output bus 75 and thus to the host electronic device 5.

FIG. 3c is a block diagram illustrating a simultaneous read-while-loading of a NOR nonvolatile memory array element 105. The simultaneous read-while-loading operation accelerates the read performance of the NOR nonvolatile memory array element 105 enabling data to be read out to the host electronic device 5 from the NOR read buffer 170 while the data is being loaded from the NOR memory array 150 and determined by the sense amplifier 154. Once the data is determined by the sense amplifier 154, it is transferred to the NOR read buffer 170 in parallel and instantly. There are multiple individual sense amplifier circuits within the sense amplifier 154 for the NOR memory array 150 such that the data from a selected byte 152a within a page 151a is read in parallel. Upon completion of the parallel sensing by the sense amplifier 154, the data is then transferred in parallel to the NOR read buffer 170. Concurrently, the next byte 152b from the page 151b is selected and the data is sensed by the sense amplifier 154. Upon completion of the sensing by the sense amplifier 154, the data of the byte 152b is then transferred to the NOR read page buffer 170 and read out from the NOR read page buffer 170 to the serial interface Input/Output bus 75 and thus to the host electronic device 5. This structure allows for simultaneous sensing of data from a byte 152b by the sense amplifier 154 and transfer of the data from a previously sensed page 152a from the NOR read page buffer 170 to the serial interface Input/Output bus 75 and thus to the host electronic device 5.

Figure 4B:
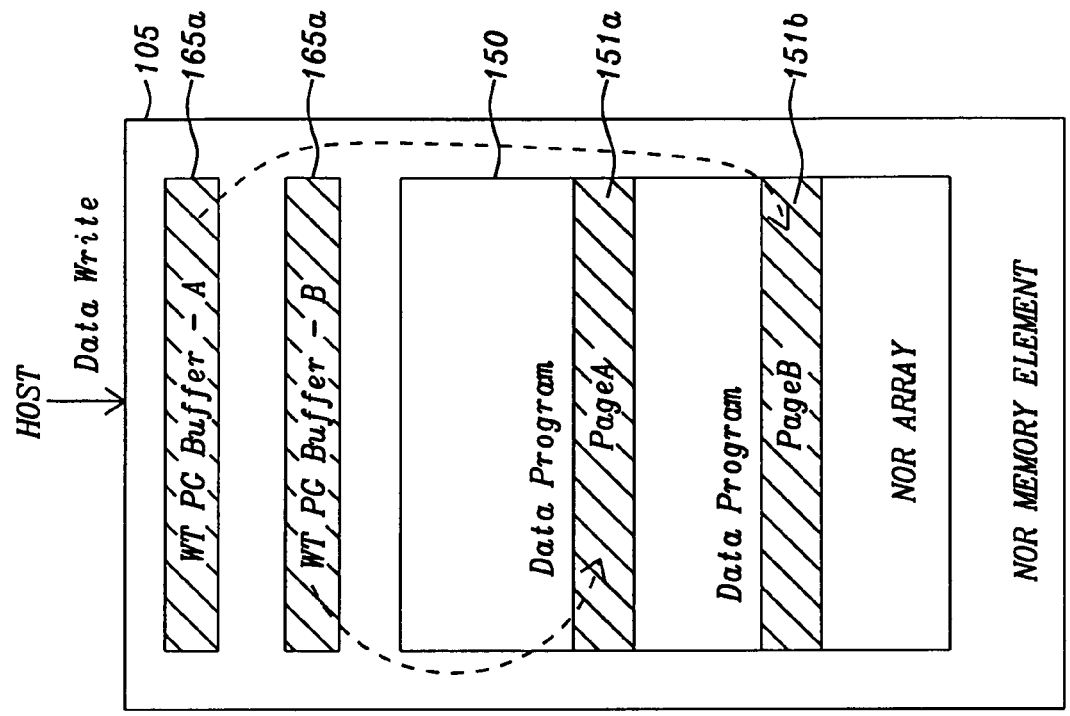
FIG. 4b is a block diagram illustrating a simultaneous write-while-programming of a NOR nonvolatile memory array embodying the principles of this invention.
Figure 4A:
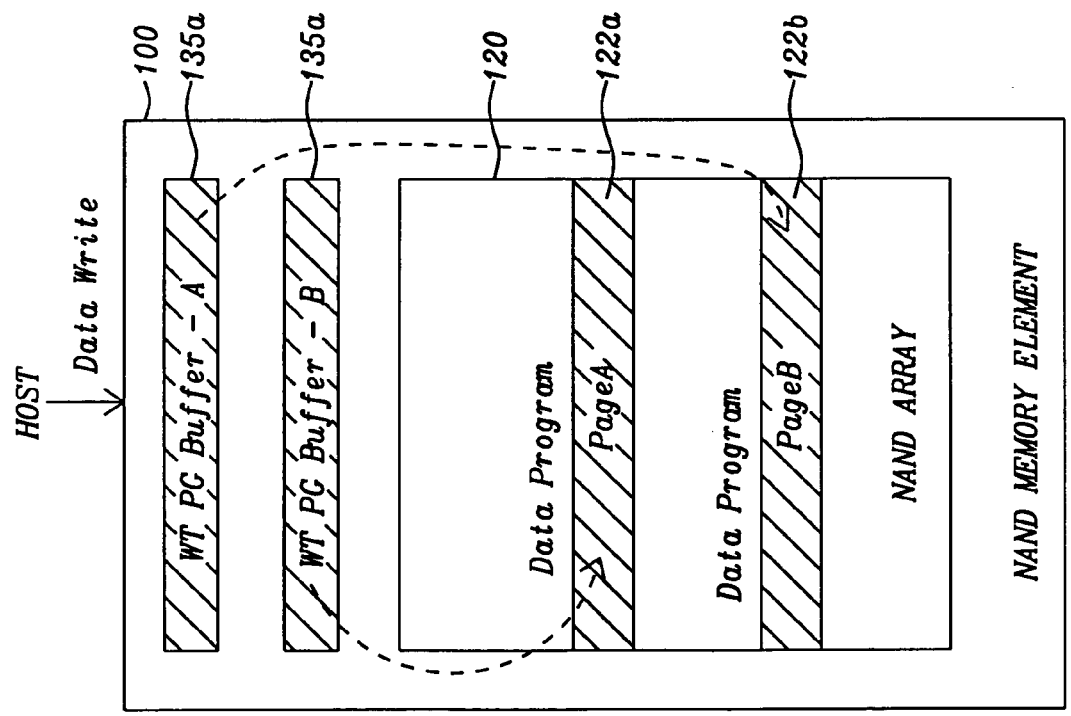
FIG. 4a is a block diagram illustrating a simultaneous write-while-programming of a NAND nonvolatile memory array embodying the principles of this invention.

FIG. 4a is a block diagram illustrating a simultaneous write-while-programming of a NAND nonvolatile memory array element 100. The simultaneous write-while-programming operation accelerates the write performance of the NAND nonvolatile memory array element 100 enabling data to be written from the host electronic device 5 to the NAND write page buffer 135a while the data is being programmed to the selected page 122a of the NAND memory array 120 from the NAND write page buffer 135b. When the data is successfully programmed to the selected page 122a, the data is programmed from the NAND write page buffer 135b and new data is written from the host electronic device 5 to the NAND write page buffer 135a. This switching of the writing of data from the host electronic device 5 to one of the NAND write page buffer 135a or 135b and the programming of a selected page 122a, . . . , 122b from the other of the NAND write page buffer 135*a* or 135*b* allows the acceleration of the write performance for the NAND nonvolatile memory array element 100.

FIG. 4*b* is a block diagram illustrating a simultaneous write-while-programming of a NOR nonvolatile memory array element 100. The simultaneous write-while-programming operation accelerates the write performance of the NOR nonvolatile memory array element 100 enabling data to be written from the host electronic device 5 to the NOR write page buffer 165*a* while the data is being programmed to the selected page 151*a* of the NOR memory array 150 from the NOR write page buffer 165*b*. When the data is successfully programmed to the selected page 151*a*, the data is programmed from the NOR write page buffer 165*b* and new data is written from the host electronic device 5 to the NOR write page buffer 165*a*. This switching of the writing of data from the host electronic device 5 to one of the NOR write page buffer 165*a* or 165*b* and the programming of a selected page 151*a*, . . . , 151*b* from the other of the NOR write page buffer 165*a* or 165*b* allows the acceleration of the write performance for the NOR nonvolatile memory array element 100.

Returning to FIG. 2, in some embodiments of nonvolatile memory unit, the at least two nonvolatile memory array elements—the NAND memory array element 100 and the NOR memory array element 105 are divided into at least two independent sub-arrays. The independent sub-arrays may be written to (programmed or erased) and read from. The control, address, and data signals are transferred from the NAND logic control circuit 125 to the NAND nonvolatile memory array element 100 and to the NOR logic control circuit 155 for the NOR memory array element 105 such that the individual NAND nonvolatile memory array element 100 and the NOR memory array element 105 may be operating concurrently. Similarly, the control, address, and data signals are transferred from the NAND logic control circuit 125 to the NAND nonvolatile memory array element 100 and to the NOR logic control circuit 155 for the NOR memory array element 105 such that the individual sub-arrays of the NAND memory array elements 120 and individual sub-array elements of the NOR memory array 150 may be operating concurrently to perform simultaneous reading and writing.

Figure 4C:
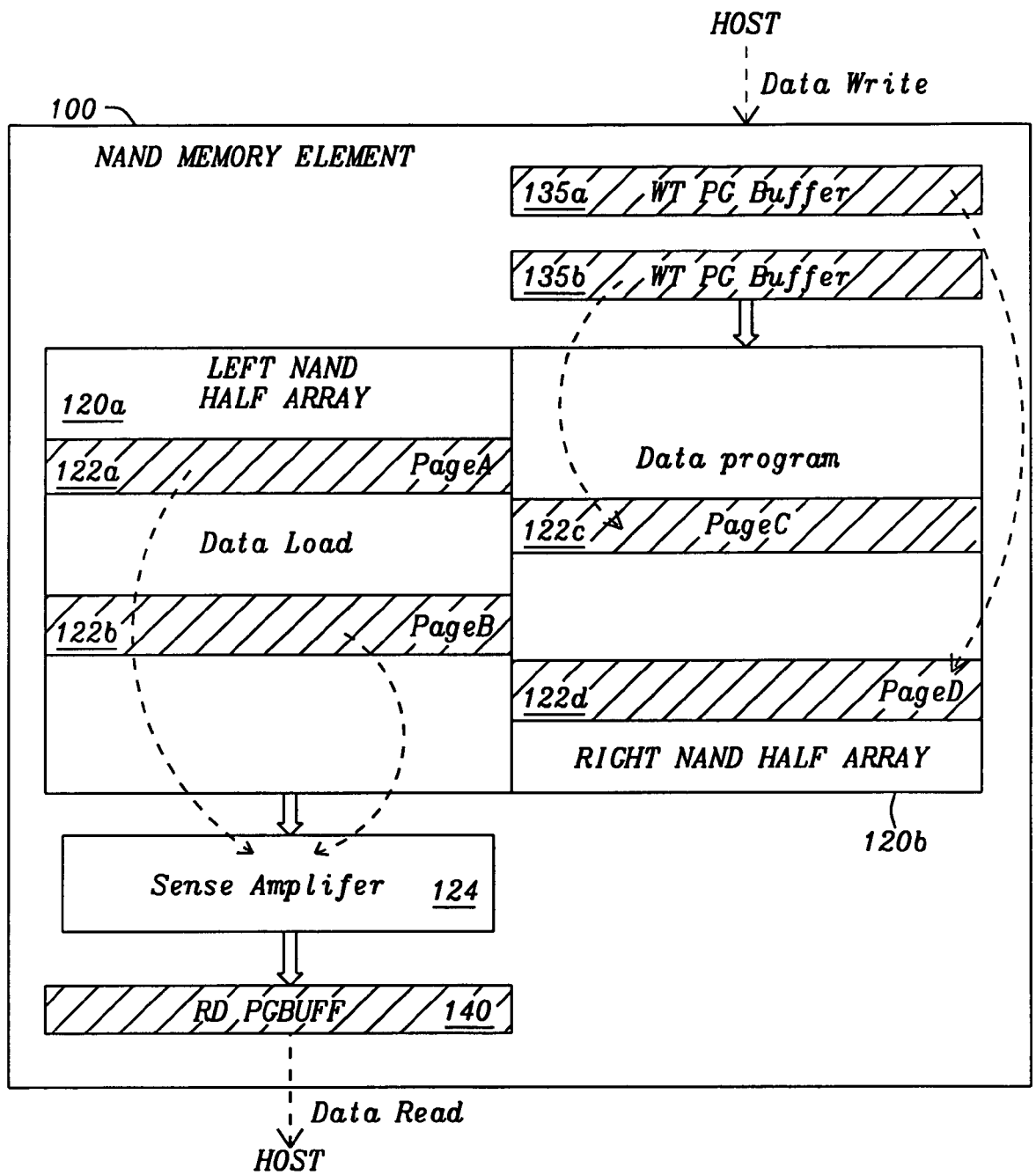
FIG. 4c is a block diagram illustrating a simultaneous read-while-loading of one sub-array and write-while-programming of a second sub-array of a NAND nonvolatile memory array embodying the principles of this invention.

FIG. 4*c* is a block diagram illustrating a simultaneous read-while-loading of one sub-array 120*a* and write-while-programming of a second sub-array 120*b* of a NAND nonvolatile memory array 100. In various embodiments, the data is loaded from a first page 122*a* of the NAND memory sub-array 120*a* and determined by the sense amplifier 124. Once the data is determined by the sense amplifier 124, it is transferred to the NAND read page buffer 140 in parallel and instantly. The multiple individual sense amplifier circuits within the sense amplifier 124 for the NAND memory sub-array 120*a* permit the data from the selected page 122*a* to be read in parallel. Upon completion of the parallel sensing by the sense amplifier 124, the data is then transferred in parallel to the NAND read page buffer 140 and read out from the NAND read page buffer 140 to the serial interface Input/Output bus 75 and thus to the host electronic device 5. Simultaneously, the next page 122*b* is selected and the data is sensed by the sense amplifier 124. Upon completion of the sensing by the sense amplifier 124, the data of the page 122*b* is then transferred to the NAND read page buffer 140 and read out from the NAND read page buffer 140 to the serial interface Input/Output bus 75 and thus to the host electronic device 5.

Concurrently, data to be written is transferred from the host electronic device 5 to the NAND write page buffer 135*a*. The data is programmed to the selected page 122*d* of the NAND memory array element 120*b*. Simultaneously data from the host electronic device 5 to the NAND write page buffer 135*b*. When the data is successfully programmed to the selected page 122*a*, the data is programmed from the NAND write page buffer 135*b* to the selected page 122*c* and new data is written from the host electronic device 5 to the NAND write page buffer 135*a*. The simultaneous read-while-loading of one sub-array 120*a* and write-while-programming of a second sub-array 120*b* of a NAND nonvolatile memory array 100 allows the acceleration of the write performance for the NAND nonvolatile memory array element 100. In various embodiments, the simultaneous read-while-loading and write-while-programming of a single of the first sub-array 120*a* or a second sub-array 120*b* of a NAND nonvolatile memory array 100 is prohibited.

Figure 4D:
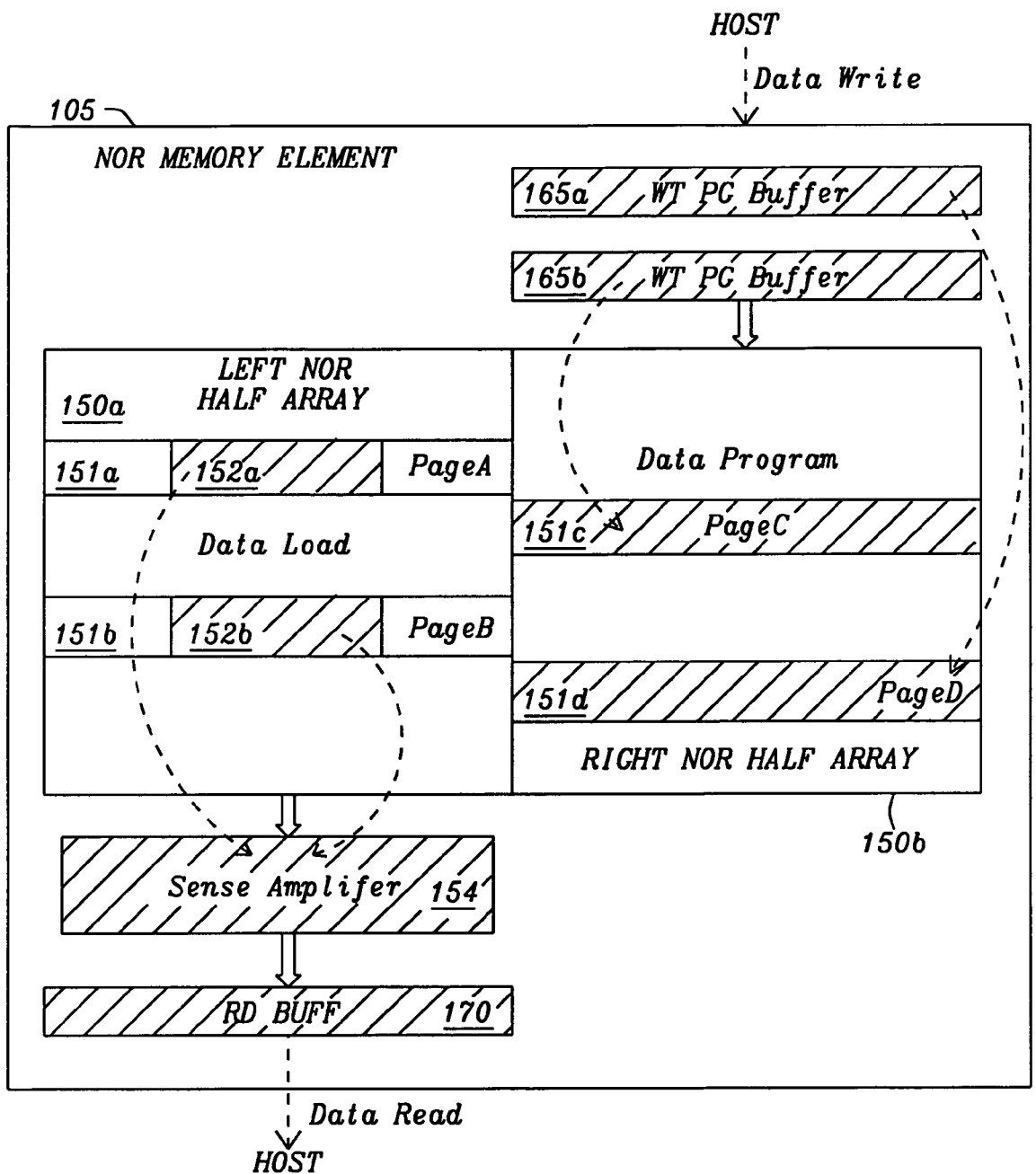
FIG. 4d is a block diagram illustrating a simultaneous read-while-loading of one sub-array and write-while-programming of a second sub-array of a NOR nonvolatile memory array embodying the principles of this invention.

FIG. 4*d* is a block diagram illustrating a simultaneous read-while-loading of one sub-array 150*a* and write-while-programming of a second sub-array 150*b* of a NOR nonvolatile memory array 105. In various embodiments, the data is loaded from a selected byte 152*a* of a first page 151*a* of the NOR memory sub-array 150*a* and determined by the sense amplifier 154. Once the data is determined by the sense amplifier 154, it is transferred to the NOR read buffer 170 in parallel and instantly. The multiple individual sense amplifier circuits within the sense amplifier 154 for the NOR memory sub-array 150*a* permit the data from the selected byte 152*a* of the page 151*a* to be read in parallel. Upon completion of the parallel sensing by the sense amplifier 154, the data is then transferred in parallel to the NOR read buffer 170 and read out from the NOR read buffer 170 to the serial interface Input/Output bus 75 and thus to the host electronic device 5. Simultaneously, the next byte 152*b* of the page 151*b* is selected and the data is sensed by the sense amplifier 154. Upon completion of the sensing by the sense amplifier 154, the data of the selected byte 152*b* of the page 151*b* is then transferred to the NOR read buffer 170 and read out from the NOR read buffer 170 to the serial interface Input/Output bus 75 and thus to the host electronic device 5.

Concurrently, data to be written is transferred from the host electronic device 5 to the NOR write page buffer 165*a*. The data is programmed to the selected page 151*d* of the NOR memory array 150*b*. Simultaneously data from the host electronic device 5 to the NOR write page buffer 165*b*. When the data is successfully programmed to the selected page 151*a*, the data is programmed from the NOR write page buffer 165*b* to the selected page 151*c* and new data is written from the host electronic device 5 to the NOR write page buffer 165*a*. The simultaneous read-while-loading of one sub-array 150*a* and write-while-programming of a second sub-array 150*b* of a NOR nonvolatile memory array 105 allows the acceleration of the write performance for the NOR nonvolatile memory array element 105. In various embodiments, the simultaneous read-while-loading and write-while-programming of a single of the first sub-array 150*a* or a second sub-array 150*b* of a NOR nonvolatile memory array 105 is prohibited.

The protocol of the serial communication interface 15 provides the chip enable CE#, the clock signal SCK, and the serial interface Input/Output bus 75 as shown in FIG. 1. The number of terminal connections or pins for the serial interface Input/Output bus 75 is determined by an integrated circuit package pin count or an integrated circuit chip Input/Output pad count. In some embodiments, the nonvolatile memory device 10 is packaged in a 16 pin package. In these embodiments, the power supply voltage level VDD, the power supply reference level VSS, the clock signal SCK, and the chip enable signal CE# occupy 4 of the pins of the package allowing the remaining 12 pins to be used for the serial interface Input/Output bus 75.

Figure 5A:
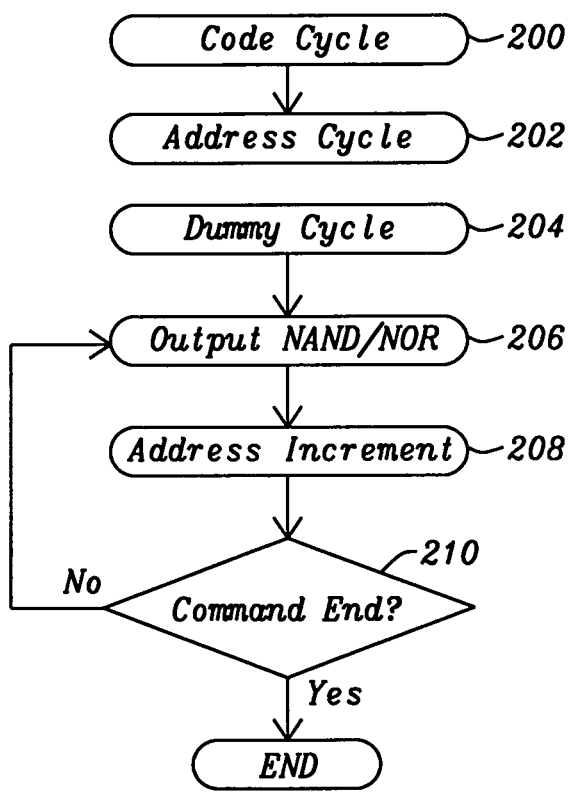
FIG. 5a is a flow chart of a method for a read operation of NAND or NOR nonvolatile memory arrays of a nonvolatile memory device embodying the principles of this invention.
Figure 5B:
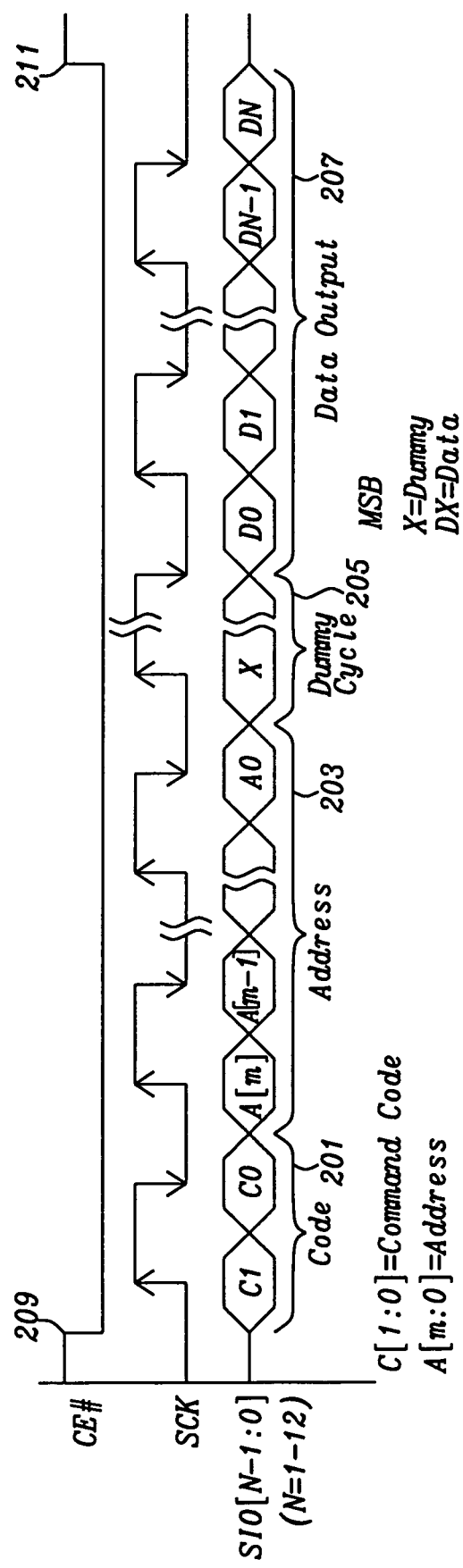
FIG. 5b is a timing diagram illustrating the waveforms of the serial interface for a read operation of NAND or NOR nonvolatile memory arrays of a nonvolatile memory device embodying the principles of this invention, where the data is read on the two edges of the clocking signal.

FIG. 5a is a flow chart of a method for a read operation of the NAND nonvolatile memory array 100 and NOR nonvolatile memory array 105 of the nonvolatile memory device 70 of FIG. 2. FIG. 5b is a timing diagram illustrating the waveforms of the serial interface for a read operation of NAND or NOR nonvolatile memory arrays of the nonvolatile memory device 70 of FIG. 2, where the data is read on the two edges of the clocking signal. Referring to FIGS. 5a and 5b, the protocol is structured such that a data transfer is initiated (Box 200) with a command code 201. The command code 201 includes a number of cycles such that the command code 201 will a have bit structure that is the product of the number of connections in the serial interface Input/Output bus 75 and the number of cycles allocated to the command code 201. In various embodiments, the command code 210 is allocated for two cycles and thus the command code 201 may have up to 24 bits. The protocol is structured such that a data transfer is initiated with a command code 201. The address 203 is received and decoded (Box 202). The address 203 includes a number of cycles such that the address will have a bit structure that is the product of the number of connections in the serial interface Input/Output bus 75 and the number of cycles allocated to the address 201. The number of address bits being allocated based on the address space of the host electronic device 5. Further, the address space A[m:0] for the NAND array or NOR array is determined by the density of the NAND array or the NOR array. In various embodiments, the address 203 is a virtual address generated by the host electronic device 5 and the virtual address is translated by the address decoding mechanism of the input address decoder circuit 115 to the physical address of the NAND nonvolatile memory array elements 100 and the NOR memory array elements 105. In read operations the address 203 is followed (Box 204) by dummy cycles 205 that are not decoded and ignored. The dummy cycles 205 are approximately equivalent to the data access time for the selected NAND nonvolatile memory array elements 100 or NOR memory array elements 105. After the dummy cycles 205, the first addressed data 207 is available for reading (Box 206). The addressed data 207 again occupies a number of cycles such that the quantity of data 207 accessed is again the product of the number of cycles and the number of connections of the serial interface Input/Output bus 75.

An operational cycle for the protocol begins with the activation 209 of the chip enable signal CE#. In most embodiments, the chip enable signal CE# is brought from a high state (logical "1") to a low state (logical "0"). The chip enable signal CE# will remain low for most commands, with the exceptions discussed hereinafter. The clock signal SCK is transferred with a duty cycle of approximately 50%. The command signals 201, address signals 203, dummy signals 205 and data signals 207 are captured or transferred on both the rising and falling edges of the clock signal SCK. Referring specifically to the command signals 201, address signals 203, dummy signals 205 and data signals 207 of the serial interface Input/Output bus 75, the command signals 201, address signals 203, and dummy signals 205 have their transitions at a set up time prior to be captured at the rising and falling edges of the clock signal SCK by the nonvolatile memory units 70a, 70b, . . . 70n of FIG. 1. The data signals 207 are triggered to be placed on the serial interface Input/Output bus 75 at the transitions of the clock signal SCK. As for the specific command(s) as described in FIG. 5a, the command code 201 is for a NAND or NOR read operation. The address 203 provides the location of the first data to be read.

When the address is decoded (Box 202) and the appropriate locations within the NAND or NOR array element are selected, the series of dummy cycles 205 indicate (Box 204) that the selected NAND or NOR array elements 100 or 105 are being accessed and read out to the page buffer circuit of the respective NAND or NOR array elements. The data output 207 is then streamed (Box 206) as described in FIGS. 3b and 3c. The first data is transmitted (Box 206), the address is incremented (Box 208), and the chip enable signal CE# is examined (Box 210) that is has been brought from the low state (logical "0") to the high state (logical "1"). If the chip enable signal CE# has not transitioned from the low state (logical "0") to the high state (logical "1"), the next data is transmitted (Box 206) and the address is incremented (Box 208) until the chip enable signal CE# is transitioned from the low state (logical "0") to the high state (logical "1"). The data output 207 is triggered by the rising and falling edges of the clock signal SCK. The respective NAND or NOR array elements 100 or 105 retrieve the quantity of data established by the command signals 201 and the data output 207 streams the data until the chip enable signal CE# is deactivated 211.

Figure 6A:
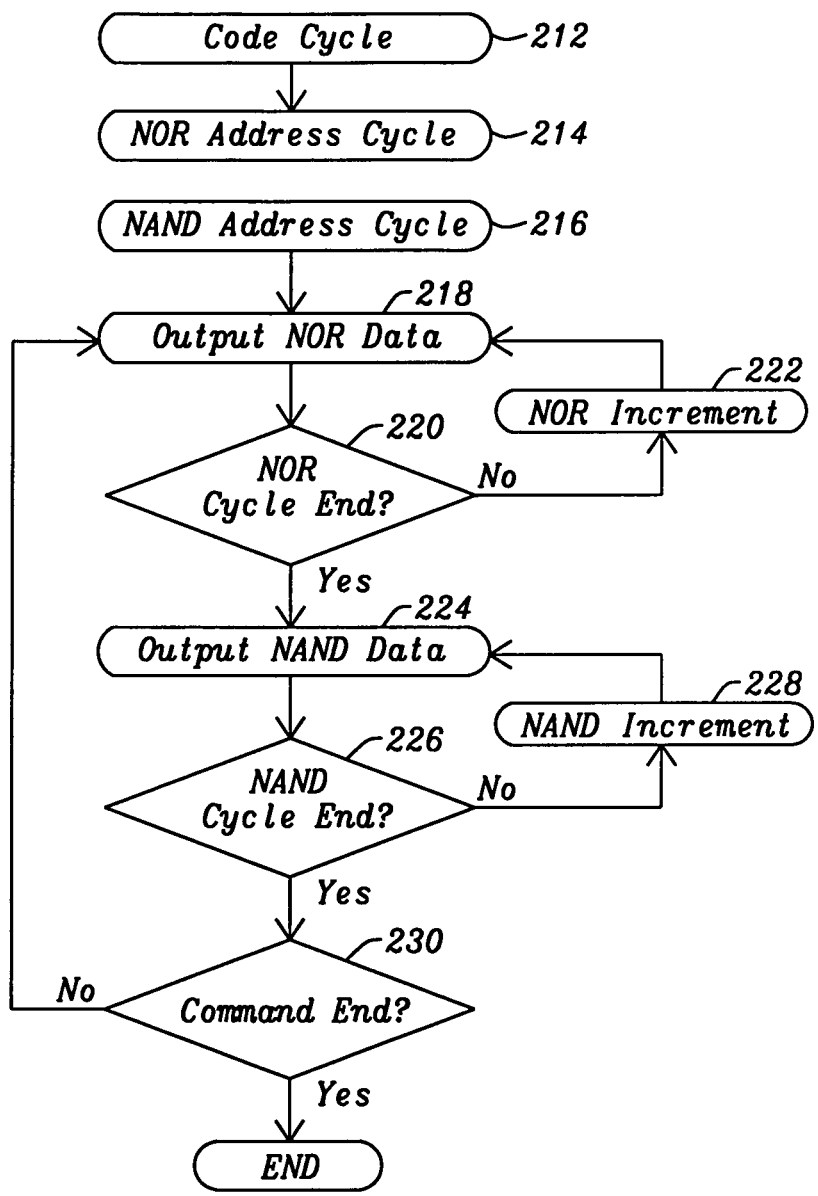
FIG. 6a is a flow chart of a method for a concurrent read operation of NAND and NOR nonvolatile memory arrays of a nonvolatile memory device embodying the principles of this invention.
Figure 6B:
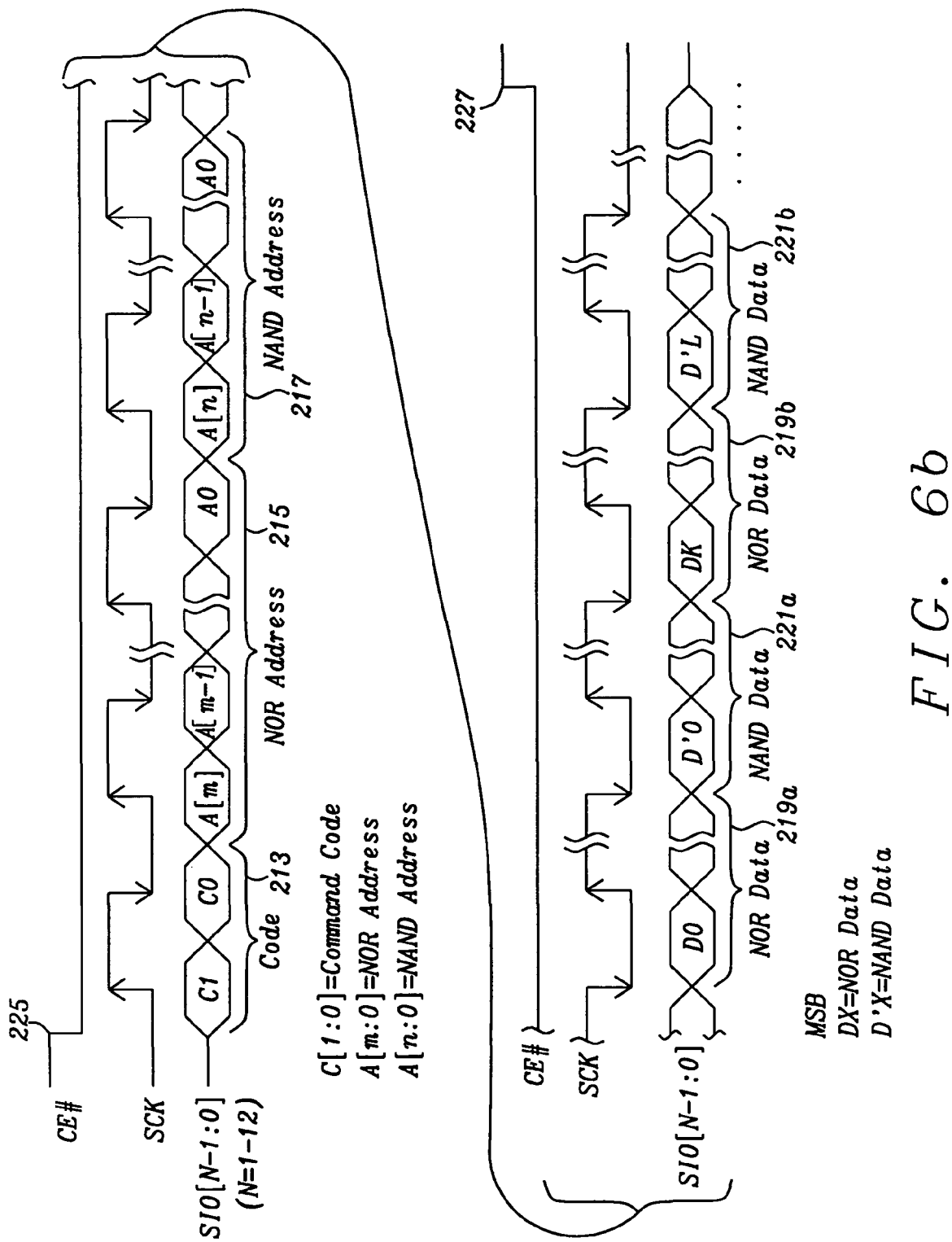
FIG. 6b is a timing diagram illustrating the waveforms of the serial interface for a concurrent read operation of NAND and NOR nonvolatile memory arrays of a nonvolatile memory device embodying the principles of this invention.

FIG. 6a is a flow chart of a method for a concurrent read operation of the NAND nonvolatile memory array 100 and NOR nonvolatile memory array 105 of the nonvolatile memory device 70 of FIG. 2. FIG. 6b is a timing diagram illustrating the waveforms of the serial interface 15 for a concurrent read operation of the NAND nonvolatile memory array 100 and NOR nonvolatile memory array 105 of the nonvolatile memory device 70 of FIG. 2. Referring to FIGS. 6a and 6b, the operational cycle for the concurrent read operation of a NAND nonvolatile memory array 100 and NOR nonvolatile memory array 105 begins with the activation 225 of the chip enable signal CE#. The chip enable signal CE# is brought from a high state (logical "1") to a low state (logical "0"). The clock signal SCK is transferred with a duty cycle of approximately 50%. The command code 213 is received and decoded (Box 212) for the concurrent NAND and NOR read operation. The NOR array address 215 is received and decoded (Box 214) to provide the location of the first data to be read from the NOR array 105. The address 217 is received and decoded (Box 216) to provide the location of the first data to read from the NAND array. The address space A[m:0] for the NOR array is determined by the density of the NOR array and the address space A[n:0] is determined by the density of the NAND array. During the period that the NAND address 217 is received, the address 215 for the NOR array is decoded and the selected location data is accessed and the data is retrieved. The quantity of data 219a, 219b, . . . that is retrieved from the NOR array is determined by the command code 213. At the completion the reception of the address 217 from the NAND array, the first segment (byte or page) of the data 219a from the NOR array is transmitted (Box 218) to the serial interface Input/Output bus 75 and thus to the host electronic device 5. The quantity of data that is to be read is examined (Box 220) to determine that the NOR read cycle is completed. The NOR read cycle being the serialization of the data retrieved from the NOR array. If it is not completed, the NOR address 215 is incremented (Box 222) and the next segment of the data 219b from the NOR array is transmitted (Box 218). This examination of the quantity of NOR data read is examined (Box 220) until all the data for the NOR cycle is read.

During the transmission of the data 219a from the NOR array, the address 217 of the NAND array is decoded and the selected location of the data is accessed and the data is retrieved. The quantity of data 221a, 221b, . . . that is retrieved from the NAND array is similarly determined by the command code 213. At the completion of the NOR data read cycle, the data 221a from the NAND array is transmitted (Box 224) to the serial interface Input/Output bus 75 and thus to the host electronic device 5. The quantity of data that is to be read is examined (Box 226) to determine that the NAND read cycle is completed. The NAND read cycle being the serialization of the data retrieved from the NAND array. If it is not completed, the NAND address 217 is incremented (Box 228) and the next segment of the data 221b from the NAND array is transmitted (Box 224). This examination of the quantity of NAND data read is examined (Box 230) until all the data for the NAND cycle is read.

The chip enable signal CE# is examined (Box 230) to determine if it has transitioned 227 from the low state (logical "0") to the high state (logical "1"). If the chip enable signal CE# has not transitioned 227, the next groupings of the NOR data 219a, 219b, . . . and the NAND data 221a, 221b, . . . are transmitted (Box 218) and (Box 224) until the chip enable signal CE# has transitioned 227 from the low state (logical "0") to the high state (logical "1").

Groupings of the data 219a, 219b, . . . from the NOR array and the data 221a, 221b, . . . from the NAND array are interleaved as the access of the NOR array and the NAND array occur during the transmission of the data 219a, 219b, . . . from the NOR array and data 221a, 221b, . . . from the NAND array to permit the data to be streamed concurrently from the NAND nonvolatile memory array 100 and NOR nonvolatile memory array 105.

Figure 7A:
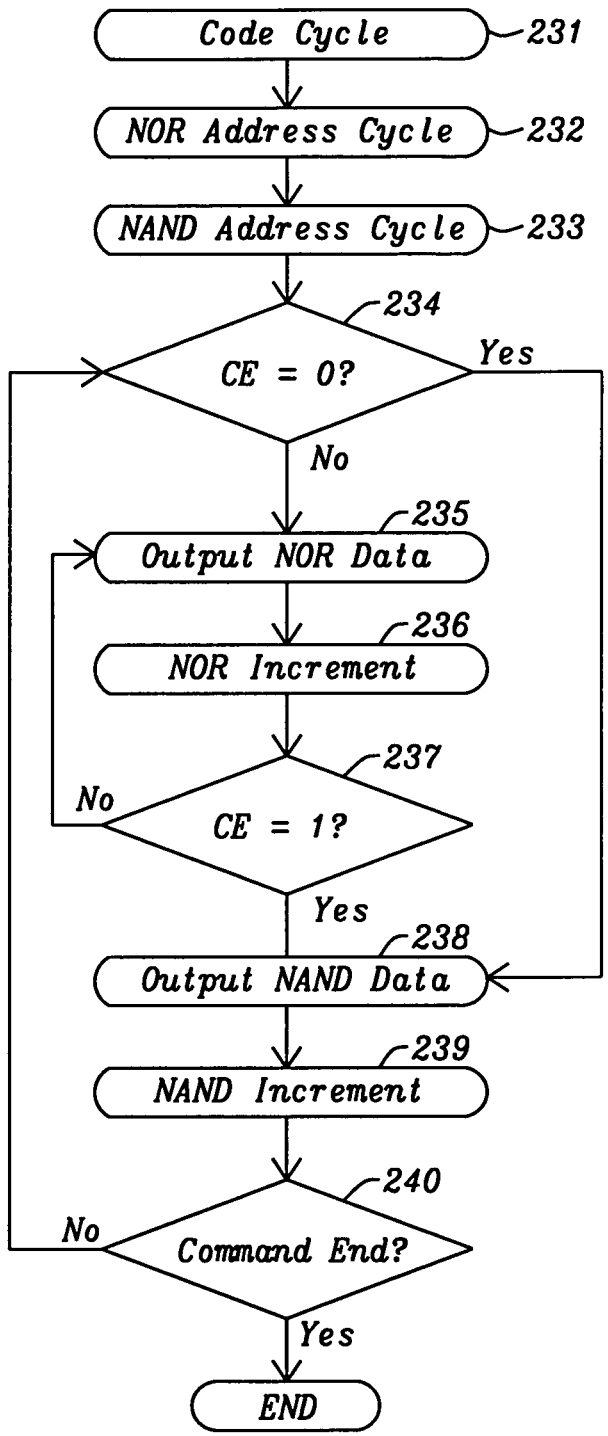
FIG. 7a is a flow chart of a method for another embodiment of a concurrent read operation of NAND and NOR nonvolatile memory arrays of a nonvolatile memory device embodying the principles of this invention.
Figure 7B:
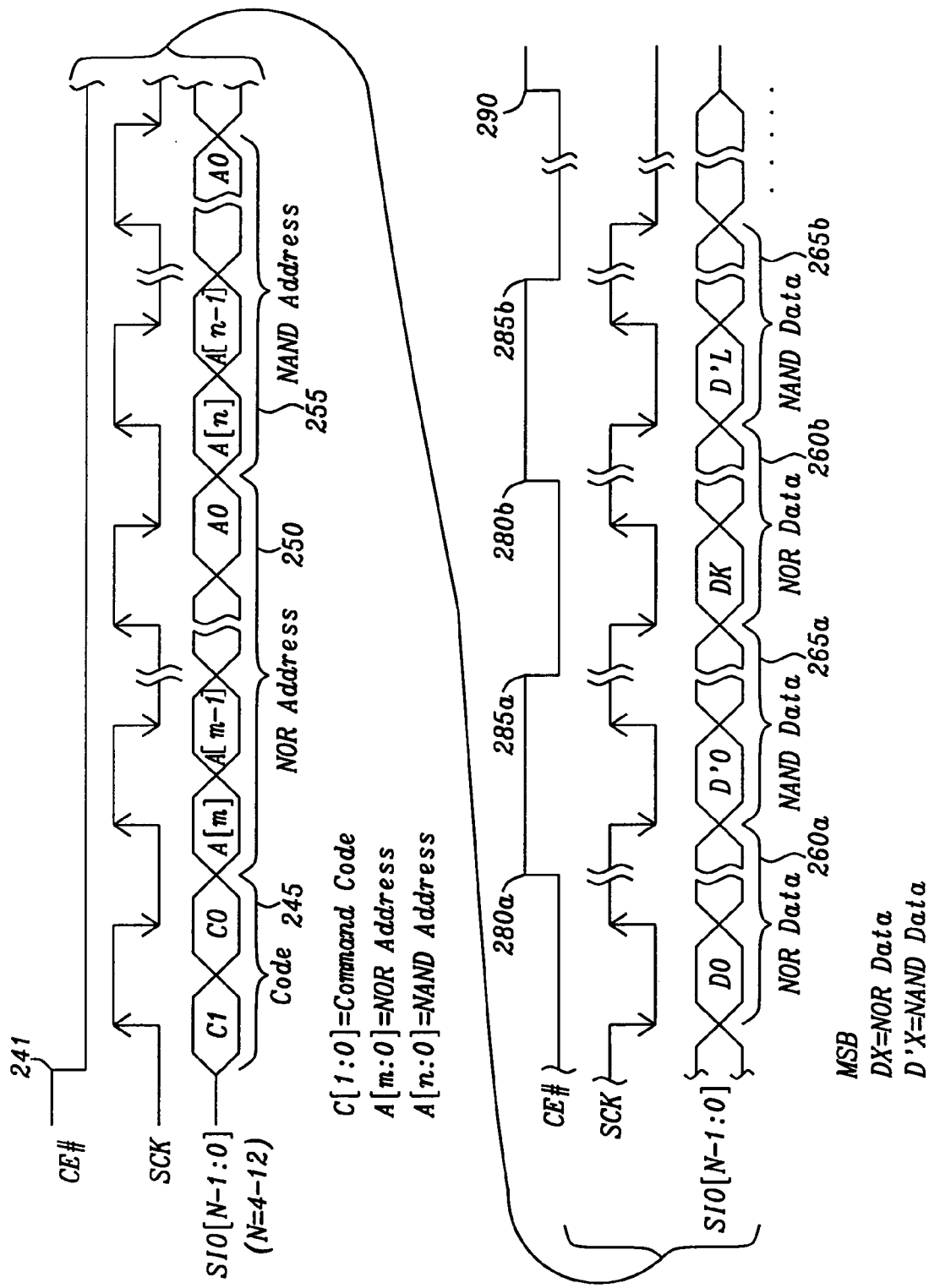
FIG. 7b is a timing diagram illustrating the waveforms of the serial interface for another embodiment of a concurrent read operation of NAND and NOR nonvolatile memory arrays of a nonvolatile memory device embodying the principles of this invention.

FIG. 7a is a flow chart of a method for another embodiment of a concurrent read operation of the NAND nonvolatile memory array 100 and NOR nonvolatile memory array 105 of the nonvolatile memory device 70 of FIG. 2. FIG. 7b is a timing diagram illustrating the waveforms of the serial interface 15 for the embodiment of FIG. 7a of a concurrent read operation of the NAND nonvolatile memory array 100 and NOR nonvolatile memory array 105 of the nonvolatile memory device 70 of FIG. 2. Referring to FIGS. 7a and 7b, the operational cycle for the concurrent read operation of a NAND nonvolatile memory array 100 and NOR nonvolatile memory array 105 begins with the activation 241 of the chip enable signal CE#. The chip enable signal CE# is brought from a high state (logical "1") to a low state (logical "0"). The clock signal SCK is transferred with a duty cycle of approximately 50%. The command code 245 for the concurrent NAND and NOR read operation is received and decoded (Box 231). The address 250 is received and decoded (Box 232) to provide the location of the first data to be read from the NOR array and the address 255 is received and decoded (Box 233) to provide the location of the first data to read from the NAND array. The address space A[m:0] for the NOR array is determined by the density of the NOR array and the address space A[n:0] is determined by the density of the NAND array. During the period that the NAND address 255 is received, the address 250 for the NOR array is decoded (Box 233) and the selected location data is accessed and the data is retrieved. The quantity of data 260a, 260b, . . . that is retrieved from the NOR array is determined by the command code 245. At the completion the reception of the address 255 from the NAND array, the chip enable signal CE# is examined (Box 234) to determine whether the chip enable signal CE# has transitioned from the low state (logical "0") to the high state (logical "1"). If the chip enable signal CE# has not transitioned from the low state (logical "0") to the high state (logical "1"), the first segment of the serialized data 260a from the NOR array is transmitted (Box 235) to the serial interface Input/Output bus 75 and thus to the host electronic device 5. The address for the next segment of the serialized data 260a is incremented (Box 236) and the enable signal CE# is examined (Box 237) to determine whether the chip enable signal CE# has transitioned from the low state (logical "0") to the high state (logical "1"). If the chip enable signal CE# has not transitioned from the low state (logical "0") to the high state (logical "1"), the next segment of the serialized data 260a from the NOR array is transmitted (Box 235) to the serial interface Input/Output bus 75 and thus to the host electronic device 5. The address of the serialized data 260a is incremented (Box 236) to point to the next portion of the serialized data 260a to be transmitted. The transmission (Box 235) of the segments of the serialized data 260a and incrementing (Box 236) of the address of the NOR data 260a continues until the chip enable signal CE# transitions from the low state (logical "0") to the high state (logical "1").

During the transmission of the data 260a from the NOR array, the address 255 of the NAND array is decoded and the selected location of the data is accessed and the data is retrieved. The quantity of data 265a, 265b, . . . that is retrieved from the NAND array is similarly determined by the command code 220. The chip enable signal CE# normally is activated 235 when the clock signal SCK is at a low level or the level of a logical (0) and the chip enable signal CE# is deactivated 240 when the clock signal SCK is similarly at the low level. In this embodiment, when the clock signal SCK is at the high level and the chip enable signal CE# transitions from the low level to the high level 280a, 280b, . . . , and the enable signal CE# is examined (Box 237) to determine whether the chip enable signal CE# has transitioned 280a from the low state (logical "0") to the high state (logical "1"), first segment of the data 265a from the NAND array is transmitted (Box 238) to the serial interface Input/Output bus 75 and thus to the host electronic device 5. The address of the serialized data 265a is incremented (Box 239) for the next segment and the quantity of data 260a, 260b, . . . that is retrieved from the NOR array and quantity of the data 265a, 265b, . . . that is retrieved from the NAND array are examined (Box 240) to determine that the command has ended. If the command has not ended, the enable signal CE# is examined (Box 234) to determine whether the chip enable signal CE# has transitioned from the low state (logical "0") to the high state (logical "1"). If the chip enable signal CE# has not transitioned from the low state (logical "0") to the high state (logical "1"), the next segment of the serialized data 265a from the NAND array is transmitted (Box 238) to the serial interface Input/Output bus 75 and thus to the host electronic device 5. The address 255 of the serialized data 265a is incremented (Box 239) to point to the next portion of the serialized data 265a to be transmitted. The transmission (Box 238) of the segments of the serialized data 265a and incrementing (Box 239) of the address of the NAND data 265a continues until the chip enable signal CE# transitions 285a from the low state (logical "0") to the high state (logical "1"), when examined (Box 234).

The next segment of the serialized data 260b from the NOR array is transmitted (Box 235) to the serial interface Input/Output bus 75 and thus to the host electronic device 5. The address for the next segment of the serialized data 260b is incremented (Box 236) and the enable signal CE# is examined (Box 237) to determine whether the chip enable signal CE# has transitioned from the low state (logical "0") to the high state (logical "1"). If the chip enable signal CE# has not transitioned from the low state (logical "0") to the high state (logical "1"), the next segment of the serialized data 260b from the NOR array is transmitted (Box 235) to the serial interface Input/Output bus 75 and thus to the host electronic device 5. The address of the serialized data 260a is incremented (Box 236) to point to the next portion of the serialized data 260a to be transmitted. The transmission (Box 235) of the segments of the serialized data 260b and incrementing (Box 236) of the address of the NOR data 260b continues until the chip enable signal CE# transitions 280b from the low state (logical "0") to the high state (logical "1").

When the enable signal CE# is examined (Box 237) and determines that the chip enable signal CE# has transitioned 280b from the low state (logical "0") to the high state (logical "1"), next segment of the data 265b from the NAND array is transmitted to the serial interface Input/Output bus 75 and thus to the host electronic device 5. The address of the serialized data 265b is incremented (Box 239) for the next segment and the quantity of data 260a, 260b, . . . that is retrieved from the NOR array and quantity of the data 265a, 265b, . . . that is retrieved from the NAND array are examined (Box 240) to determine that the command has ended. If the command has not ended, the enable signal CE# is examined (Box 234) to determine whether the chip enable signal CE# has transitioned from the low state (logical "0") to the high state (logical "1"). If the chip enable signal CE# has not transitioned from the low state (logical "0") to the high state (logical "1"), the next segment of the serialized data 265b from the NAND array is transmitted (Box 238) to the serial interface Input/Output bus 75 and thus to the host electronic device 5. The address of the serialized data 265b is incremented (Box 239) to point to the next portion of the serialized data 265b to be transmitted. The transmission (Box 238) of the segments of the serialized data 265b and incrementing (Box 239) of the address of the NAND data 265b continues until the chip enable signal CE# transitions 285b from the low state (logical "0") to the high state (logical "1"), when examined (Box 234) and the next data 260a, 260b, . . . is transmitted. This continues until the examination (Box 240) of the chip enable signal CE# transitions 290 from the low state (logical "0") to the high state (logical "1") during a period when the clock signal SCK is at a low level that the command for the transmission of data from the concurrent read operation of the NAND nonvolatile memory array 100 and NOR nonvolatile memory array 105 is ended. The groupings of the data 260a, 260b, . . . from the NOR array and the data 265a, 265b, . . . from the NAND array are interleaved as the chip enable signal CE# transitions from the low level to the high level 280a, 280b, . . . and from the high level to the low level 285a, 285b, . . . . The access of the NOR array and the NAND array occur during the transmission of the data 260a, 260b, . . . from the NOR array and data 265a, 265b, . . . from the NAND array to permit the data to be streamed concurrently from the NAND nonvolatile memory array 100 and NOR nonvolatile memory array 105 with a mixed amount of data from the data 260a, 260b, . . . from the NOR array and data 265a, 265b, . . . from the NAND array. As stated above the cycle for the command of the concurrent mixed read of the NAND and NOR array ends when the chip enable signal CE# is deactivated 290 when the clock signal SCK is similarly at the low level.

Figure 8:
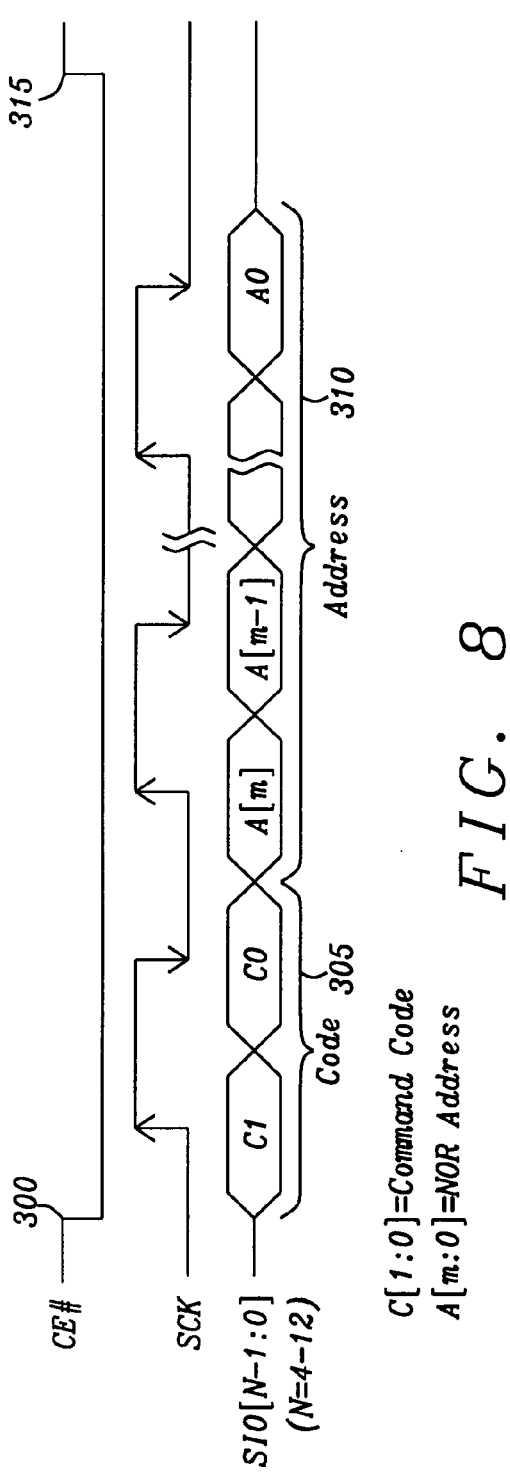
FIG. 8 is a timing diagram illustrating the waveforms of the serial interface for an erase operation of NAND or NOR nonvolatile memory arrays of a nonvolatile memory device embodying the principles of this invention.

FIG. 8 is a timing diagram illustrating the waveforms of the serial interface for an erase operation of a NAND nonvolatile memory array 100 and NOR nonvolatile memory array 105 of a nonvolatile memory device 70 of FIG. 2. The operational cycle for the erase of a NAND nonvolatile memory array 100 or NOR nonvolatile memory array 105 begins with the activation of the chip enable signal CE#. The chip enable signal CE# is brought 300 from a high state (logical "1") to a low state (logical "0"). The clock signal SCK is transferred with a duty cycle of approximately 50%. The command code 305 is for the concurrent NAND and NOR erase operation. The address 310 provides the location of the data to be erased from the NOR array or from the NAND array. The address space A[m:0] for the NOR array or the NAND array is determined by the density of the NOR array or the density of the NAND array. Once the address is determined the NAND nonvolatile memory array 100 or the NOR nonvolatile memory array 105 activates the erase process and the segment (page, block, sector, or entire chip) of the NAND nonvolatile memory array 100 or the NOR nonvolatile memory array 105 is erased. After the transmission of the address 310 NAND nonvolatile memory array 100 or the NOR nonvolatile memory array 105 that is erased, the chip enable signal CE# transitions 315 from the low level to the high level.

Figure 9:
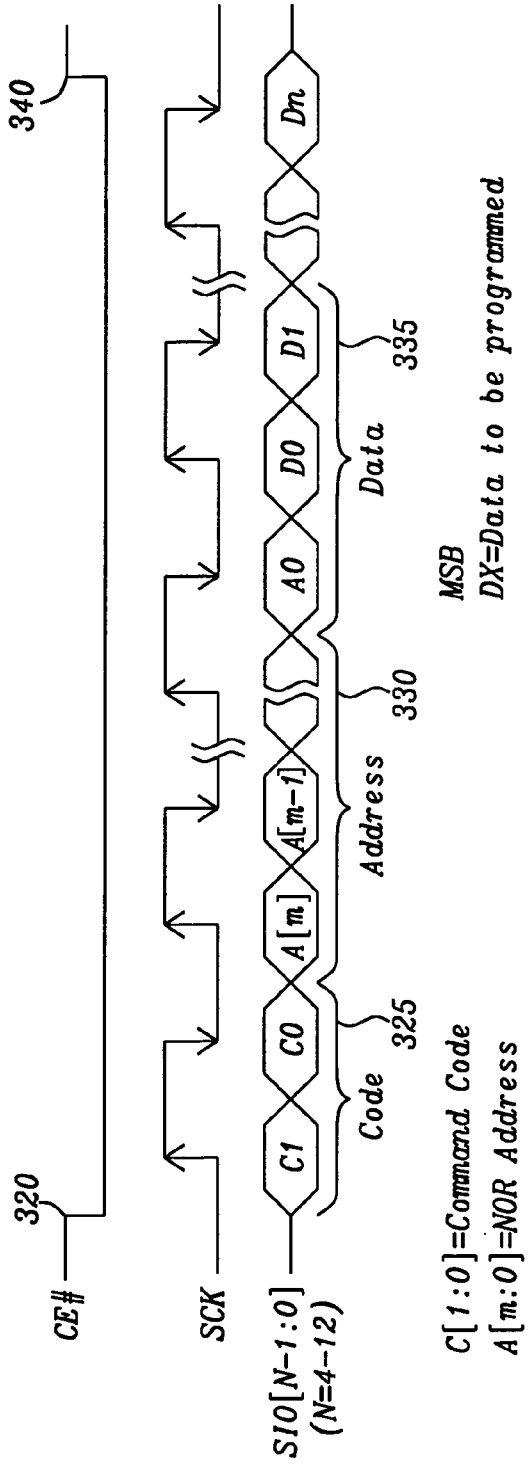
FIG. 9 is a timing diagram illustrating the waveforms of the serial interface for a program operation of NAND or NOR nonvolatile memory arrays of a nonvolatile memory device embodying the principles of this invention.

FIG. 9 is a timing diagram illustrating the waveforms of the serial interface for a program operation of a NAND nonvolatile memory array 100 and NOR nonvolatile memory array 105 of a nonvolatile memory device 70 of FIG. 2. The operational cycle for the program of a NAND nonvolatile memory array 100 or NOR nonvolatile memory array 105 begins with the activation of the chip enable signal CE#. The chip enable signal CE# is brought 320 from a high state (logical "1") to a low state (logical "0"). The clock signal SCK is transferred with a duty cycle of approximately 50%. The command code 325 is for the program operation. The address 330 provides the location of the data to be programmed to the NOR array or from the NAND array. The address space A[m:0] for the NOR array or the NAND array is determined by the density of the NOR array or the density of the NAND array. Once the address is determined the NAND nonvolatile memory array 100 or the NOR nonvolatile memory array 105 activates the program process and data 335 to be stored to the NOR array or the NAND array is received from the serial interface Input/Output bus 75. The segment (page, block, sector, or entire chip) of the NAND nonvolatile memory array 100 or the NOR nonvolatile memory array 105 is programmed. After the transmission of the address 310 NAND nonvolatile memory array 100 or the NOR nonvolatile memory array 105 that is programmed, the chip enable signal CE# transitions 340 from the low level to the high level.

Figure 10:
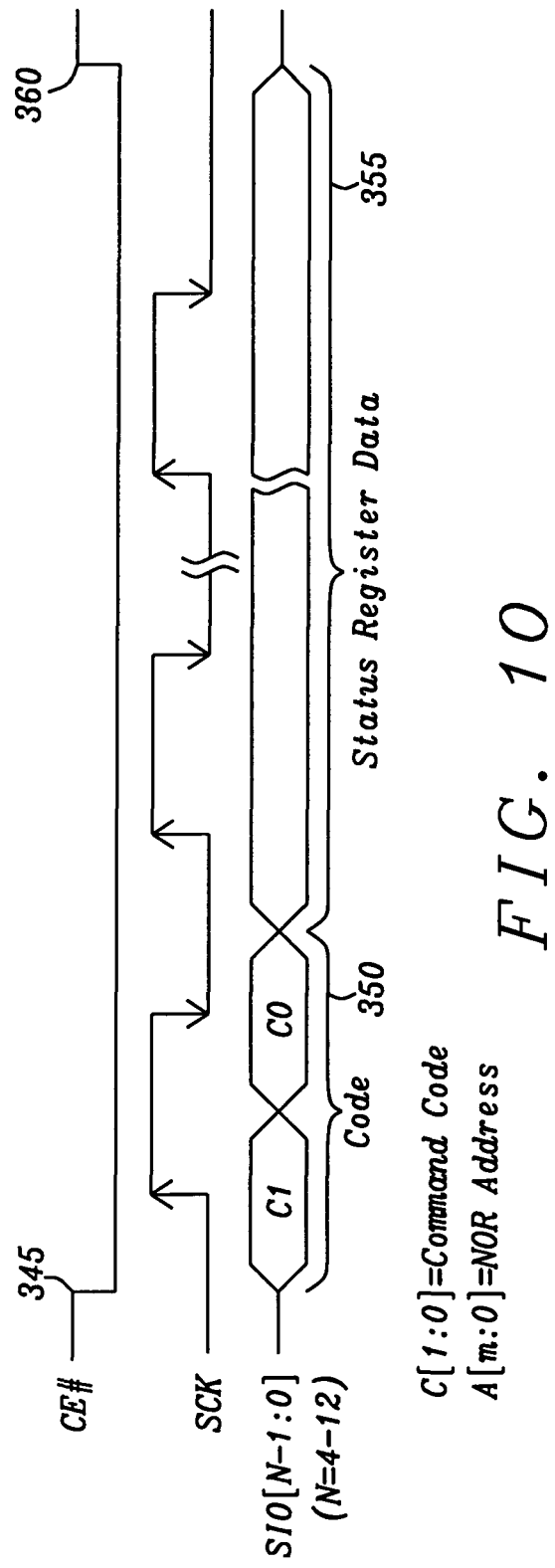
FIG. 10 is a timing diagram illustrating the waveforms of the serial interface for a status register read operation of NAND or NOR nonvolatile memory arrays of a nonvolatile memory device embodying the principles of this invention.

FIG. 10 is a timing diagram illustrating the waveforms of the serial interface for a status register read operation of a NAND nonvolatile memory array 100 and NOR nonvolatile memory array 105 of a nonvolatile memory device 70 of FIG. 2. The status register provides a record of the progress for a write (erase or program) operation to the NAND nonvolatile memory array 100 or the NOR nonvolatile memory array 105. The status register read operations are essentially memory read operations to specific locations within the NAND nonvolatile memory array 100 or the NOR nonvolatile memory array 105. The operational cycle for the status register read operation of a NAND nonvolatile memory array 100 or NOR nonvolatile memory array 105 begins with the activation of the chip enable signal CE#. The chip enable signal CE# is brought 345 from a high state (logical "1") to a low state (logical "0"). The clock signal SCK is transferred with a duty cycle of approximately 50%. The command code 350 is for the status register read operation. The status register identifier within the command code 350 provides the designator for the status register to be read from the NOR array or from the NAND array. Once the location of the status register to be read is determined, the NAND nonvolatile memory array 100 or the NOR nonvolatile memory array 105 activates the status register read process and status register contents 355 from the NOR array or the NAND array transferred to the serial interface Input/Output bus 75. After the transmission of the status register contents 355, the chip enable signal CE# transitions 360 from the low level to the high level.

Figure 11A:
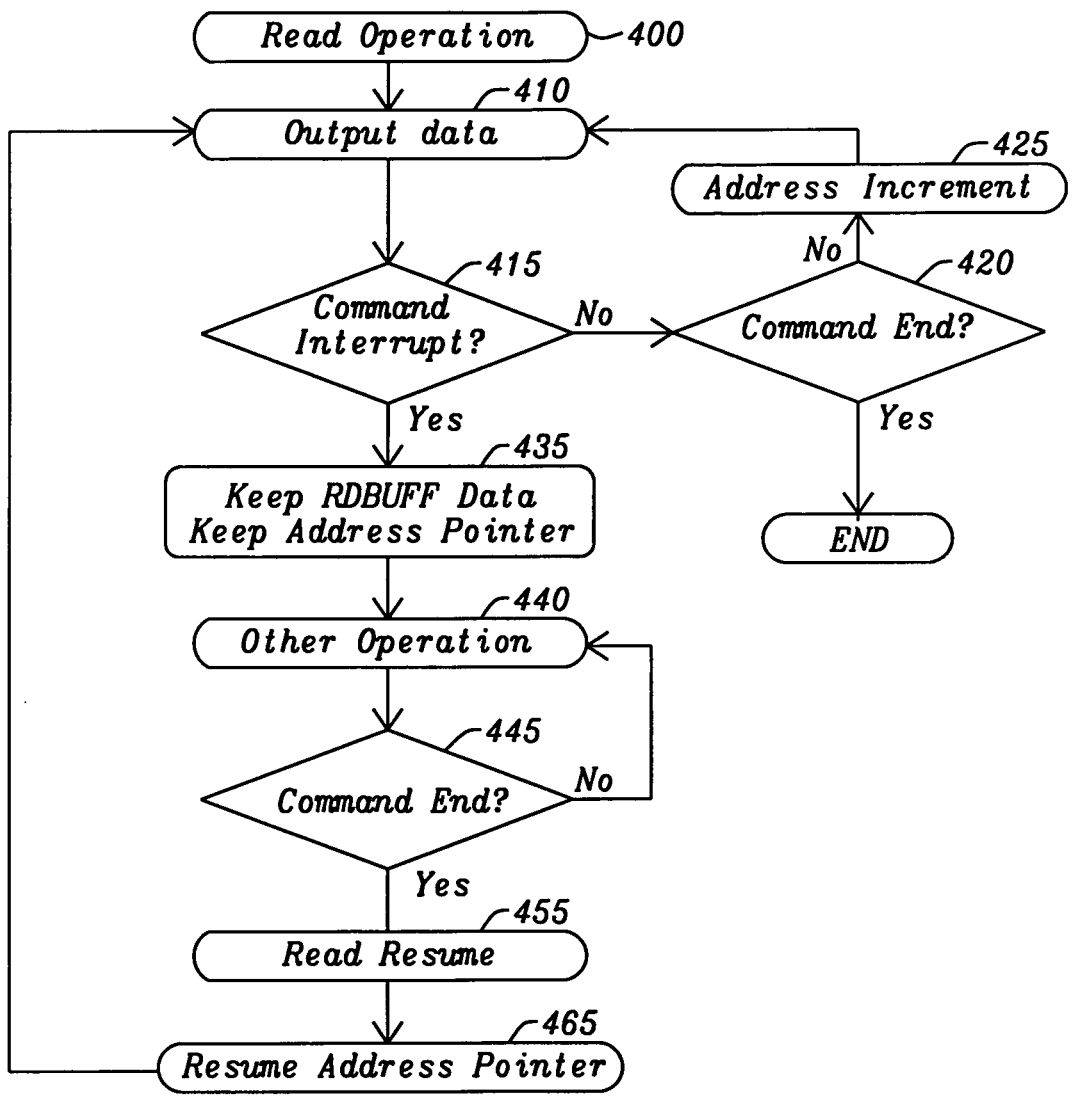
FIG. 11a is a flow chart of a method for a read resume operation of NAND or NOR nonvolatile memory arrays of a nonvolatile memory device embodying the principles of this invention.
Figure 11B:
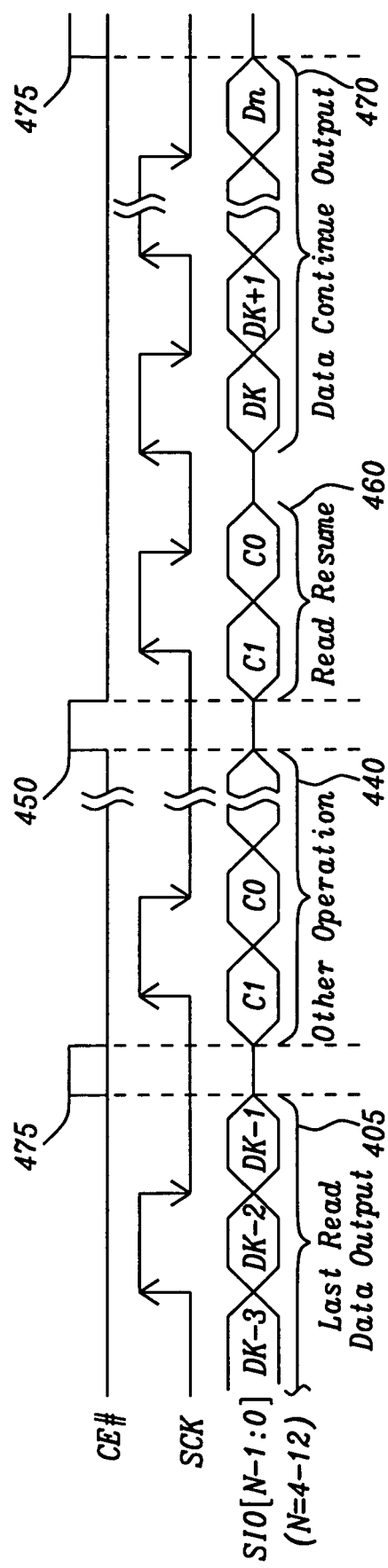
FIG. 11b is a timing diagram illustrating the waveforms of the serial interface for a read resume operation of NAND or NOR nonvolatile memory arrays of a nonvolatile memory device embodying the principles of this invention.

FIG. 11a is a flow chart of a method for a read resume operation of the NAND nonvolatile memory array 100 and NOR nonvolatile memory array 105 of the nonvolatile memory device 70 of FIG. 2. FIG. 11b is a timing diagram illustrating the waveforms of the serial interface for a read resume operation of the NAND nonvolatile memory array 100 and NOR nonvolatile memory array 105 of the nonvolatile memory device 70 of FIG. 2. In the read resume operation, a read operation (Box 400) as described above is in progress with the chip enable signal CE# at the low state (logical "0") and the clock signal SCK being transferred with a duty cycle of approximately 50%. The output data 405 is transferred (Box 410) to the serial interface Input/Output bus 75. The chip enable signal CE# is examined (Box 415) to determine that a command interruption has occurred. If there is no interruption, the chip enable signal CE# is examined (Box 420) for a command end 475. If there is not command end 475, the address is incremented (Box 425) for the next segment of the output data and the output data 405 is transferred (Box 410) to the serial interface Input/Output bus 75.

When the clock signal SCK is at an extended low state, the chip enable signal CE# is brought 430 from the low state to the high state and then is returned to the low state, a command interrupt is determined (Box 415) to have occurred. The NAND nonvolatile memory array 100 and NOR nonvolatile memory array 105 terminates the existing read operation. The data in memory read buffer 140 or 170 of FIG. 2 and current address pointer is retained (Box 435). At the transitions of the next clock signal SCK, the command code of a next operation is decoded and another operation is executed (Box 440). The other operation 440 may be any operation with the exception of a memory read operation. The chip enable signal CE# is examined that the other operation 440 has completed (Box 445). If not, the other operation is executed (Box 440) until the clock signal SCK is at an extended low state and the chip enable signal CE# is brought 450 from the low state to the high state and then is returned to the low state. The command code 460 is decoded to determine that the operation to be executed (Box 455) is for a read resume. The address pointer is restored (Box 465) and the data is transferred 470 from the read buffer 140 or 170 to the serial interface Input/Output bus 75 to complete the read operation (Box 410) initiated by the command of the operation (Box 400) that was interrupted. The chip enable signal CE# is examined (Box 415) to determine that a command interruption has occurred. If there is no interruption, the chip enable signal CE# is examined (Box 420) for a command end 475. If there is no command end 475, the address is incremented (Box 425) for the next segment of the output data and the output data 405 is transferred (Box 410) to the serial interface Input/Output bus 75. When the clock signal SCK is at an extended low state, the chip enable signal CE# is brought 475 from the low state to the high state, the command end is determined (Box 420) to have occurred and the read resume process is ended.

Figure 12A:
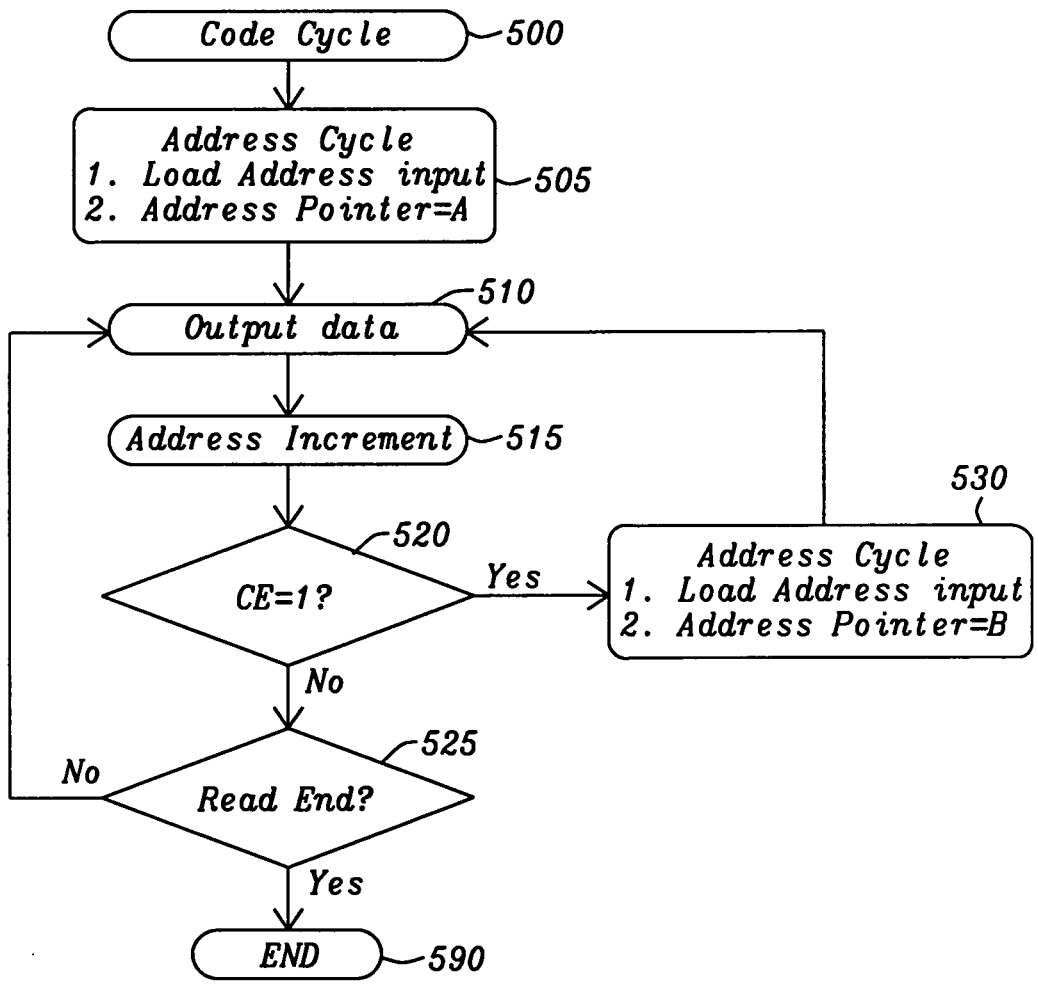
FIG. 12a is a flow chart of a method for a read jump operation of NAND or NOR nonvolatile memory arrays of a nonvolatile memory device embodying the principles of this invention.
Figure 12B:
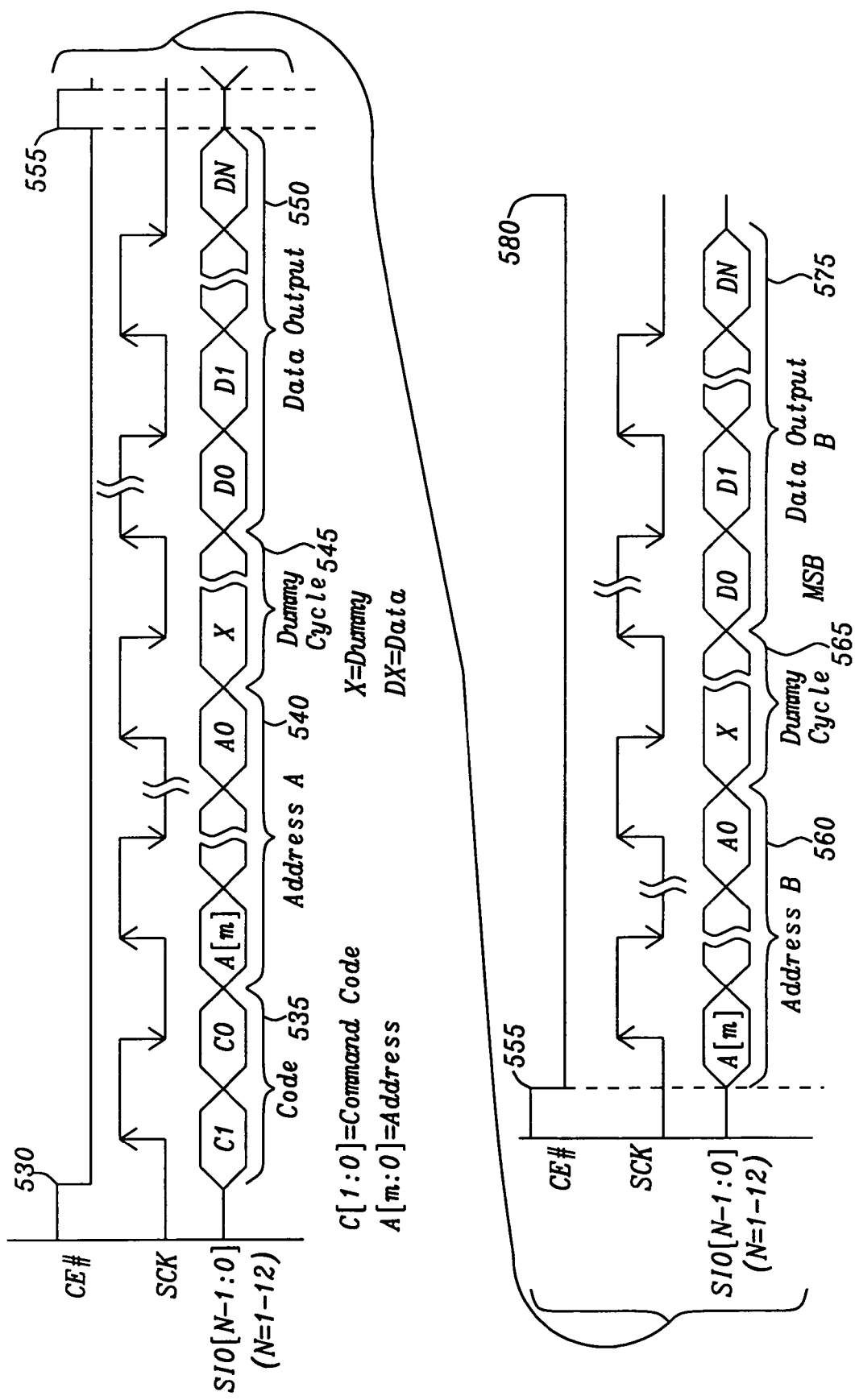
FIG. 12b is a timing diagram illustrating the waveforms of the serial interface for a read jump operation of NAND or NOR nonvolatile memory arrays of a nonvolatile memory device embodying the principles of this invention.

FIG. 12a is a flow chart of a method for a read jump operation of NAND or NOR nonvolatile memory arrays 100 or 105 of a nonvolatile memory device 70 of FIG. 2. FIG. 12b is a timing diagram illustrating the waveforms of the serial interface for a read jump operation of NAND or NOR nonvolatile memory arrays 100 or 105 of a nonvolatile memory device 70 of FIG. 2. Referring to FIGS. 12a and 12b, the protocol is structured such that a data transfer is initiated (Box 500) at the activation 530 of the chip enable signal CE# with receiving a command code 535. The command code 535 describes that the action to be executed is a read jump indicating that the read operation for a selected NAND or NOR nonvolatile memory arrays 100 or 105 may be interrupted and the read will then be executed at a new location to continue the read operation. The command code 535 is as described in FIGS. 5a and 5b for the command code 210 of the normal read operation. The starting address 540 for the location of the initial data to be read is received and decoded (Box 505). The current address pointer (not shown) within the serial interface control circuit 110 of FIG. 2 is set to the decoded starting address 540. The starting address 540 is structured as is as described in FIGS. 5a and 5b for the address coded 203 of the normal read operation. In read operations the address 540 is followed by dummy cycles 545 that are not decoded and ignored. The dummy cycles 545 are approximately equivalent to the data access time for the selected NAND nonvolatile memory array elements 100 or NOR memory array elements 105. After the dummy cycles 545, the first addressed data 550 is transferred (Box 510) from the selected NAND or NOR nonvolatile memory arrays 100 or 105 to the serial interface Input/Output bus 75 of FIG. 2.

The read operation (Box 510) as described above is in progress with the chip enable signal CE# at the low state (logical "0") and the clock signal SCK being transferred with a duty cycle of approximately 50%. The address is incremented (Box 515). The chip enable signal CE# is examined (Box 520) to determine that a command interruption 555 has occurred. If there is no interruption 555, the chip enable signal CE# is examined (Box 525) for a command end 580 and the operation is terminated. If there is no command end 580, the output data 550 for the next incremented address is transferred (Box 510) to the serial interface Input/Output bus 75.

When the clock signal SCK is at an extended low state, the chip enable signal CE# is brought 555 from the low state to the high state and then is returned to the low state, a command interrupt is determined to have occurred. The NAND nonvolatile memory array 100 or NOR nonvolatile memory array 105 terminates the existing read operation. The jump address 560 for the location of the second data to be read is received and decoded (Box 530). The current address pointer (not shown) within the serial interface control circuit 110 of FIG. 2 is set to the decoded jump address 560. The jump address 560 is structured as is as described in FIGS. 5a and 5b for the address coded 203 of the normal read operation. In read operations, the jump address 560 is followed by dummy cycles 565 that are not decoded and ignored. The dummy cycles 565 are approximately equivalent to the data access time for the selected NAND nonvolatile memory array elements 100 or NOR memory array elements 105. After the dummy cycles 565, the second data 575 is transferred (Box 510) from the selected NAND or NOR nonvolatile memory arrays 100 or 105 to the serial interface Input/Output bus 75 of FIG. 2.

The address is again incremented (Box 515). The chip enable signal CE# is examined (Box 520) to determine that another command interruption 555 has occurred. If there is no interruption 555, the chip enable signal CE# is examined (Box 525) for a command end 580 and the operation is terminated. If there is no command end 580, the output data 550 for the next incremented address is transferred (Box 510) to the serial interface Input/Output bus 75. The address is incremented 515 and the chip enable signal CE# is examined (Box 520) to determine that another command interruption 555 has occurred, until when the chip enable signal CE# is examined (Box 525) and the command end 580 indicates that and end of process (Box 590) has occurred.

Figure 13A:
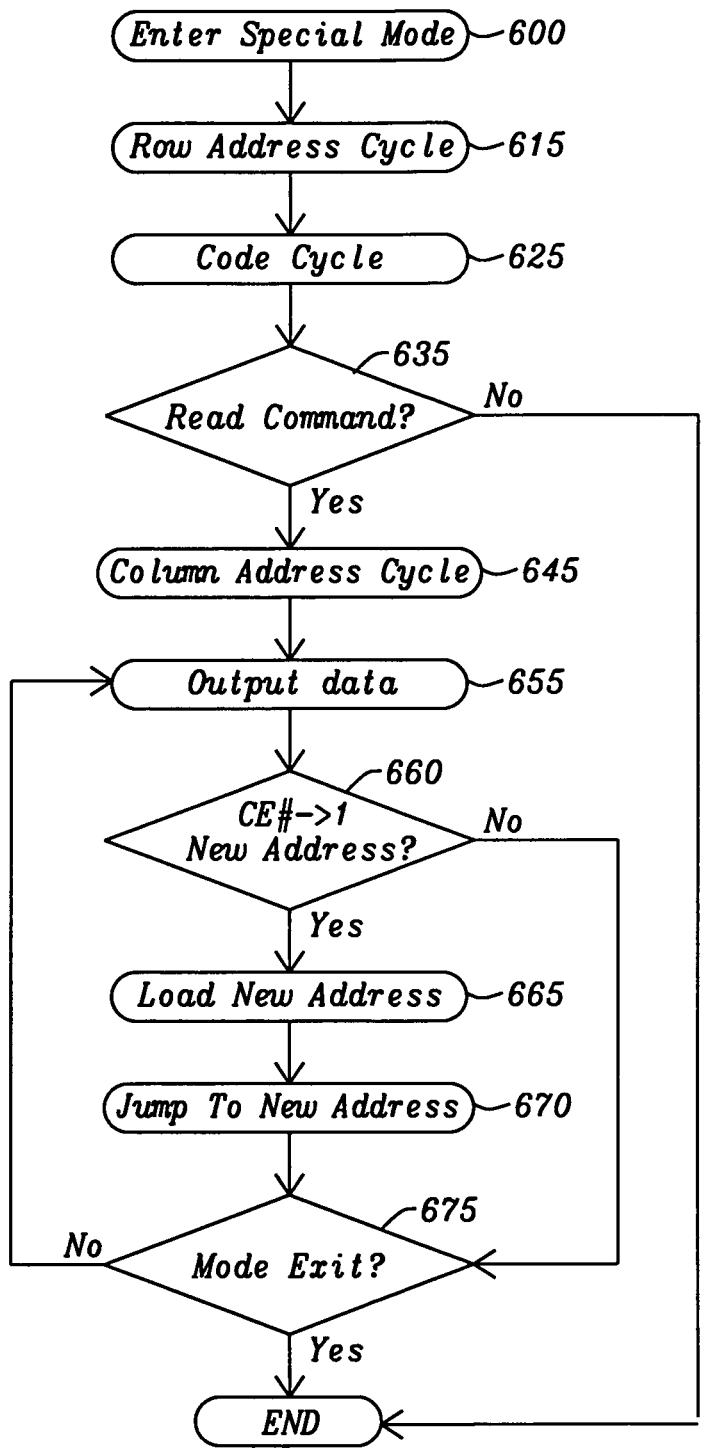
FIG. 13a is a flow chart of a method for an Address Ahead Input Read operation of NAND or NOR nonvolatile memory arrays of a nonvolatile memory device embodying the principles of this invention.
Figure 13B:
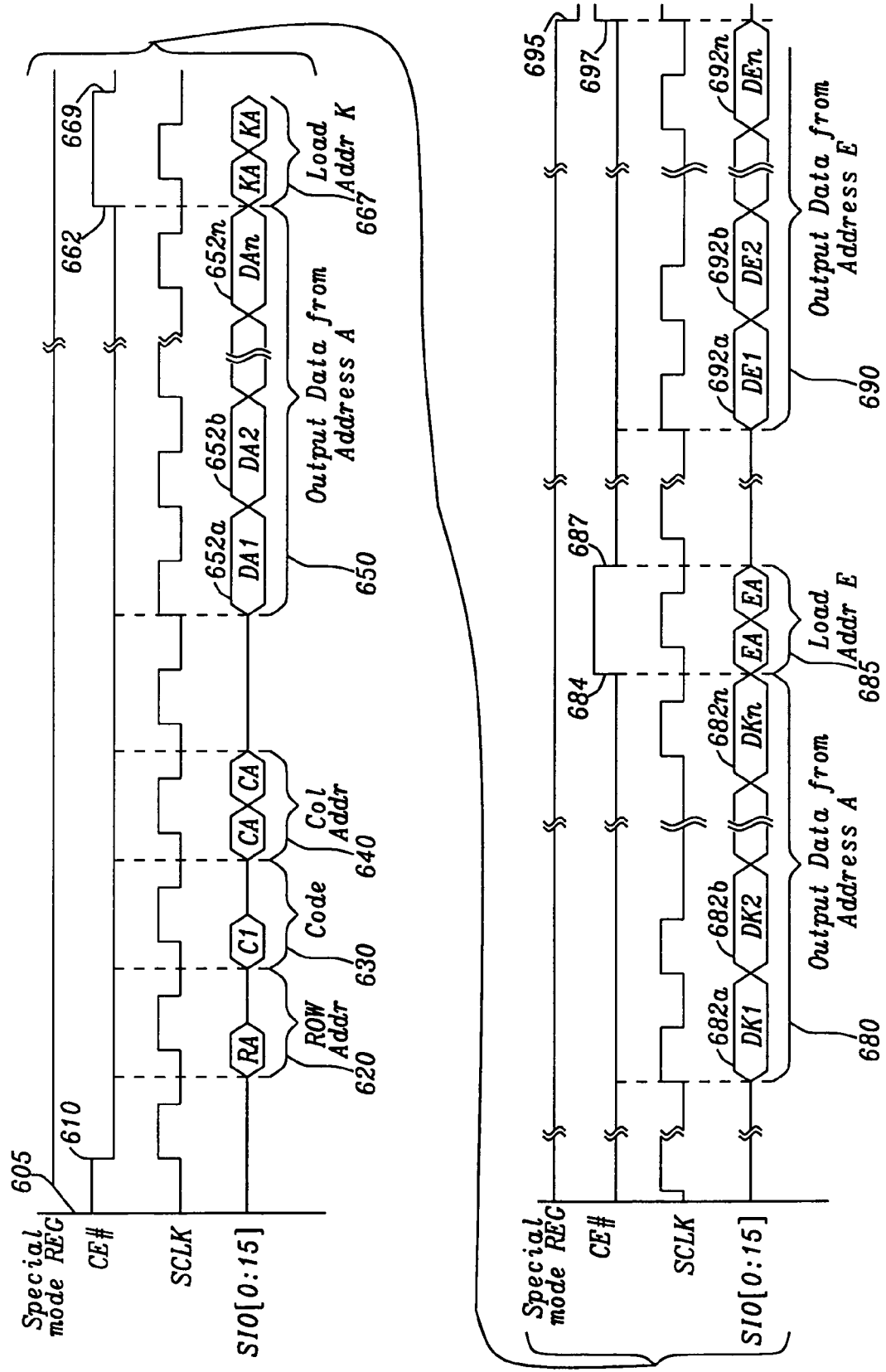
FIG. 13b is a timing diagram illustrating the waveforms of the serial interface for an Address Ahead Input Read operation of NAND or NOR nonvolatile memory arrays of a nonvolatile memory device embodying the principles of this invention.

FIG. 13a is a flow chart of a method for an Address Ahead Input Read operation of NAND or NOR nonvolatile memory array elements 100 or 105 of a nonvolatile memory device 70 of FIG. 2. FIG. 13b is a timing diagram illustrating the waveforms of the parallel interface for an Address Ahead Input Read operation of NAND or NOR nonvolatile memory array elements 100 or 105 of a nonvolatile memory device 70 of FIG. 2. Referring to FIGS. 13a and 13b, the protocol is structured such that an Address Ahead Read operation is initiated at the activation 600 of the special mode of operation by the activation 605 of the special mode register. The special mode register is activated as a result of a previous command transmitted from the host electronic device 5 and executed by the control circuitry of the NAND nonvolatile memory array element 100 and NOR nonvolatile memory array element 105 of each of the multiple nonvolatile memory units 70a, 70b, . . . , 70n. The chip enable signal CE# is activated 610. The next data present on the serial interface Input/Output bus 75 is a row address code 620 that is received and decoded (Box 615). The row address code 620 describes the row of the selected NAND nonvolatile memory arrays 100 and NOR nonvolatile memory arrays 105 that are to be read.

The command code 630 is received and decoded (Box 635). The command code 630 describes that the action to be executed is the Address Ahead Read operation in which the read operation for a selected NAND or NOR nonvolatile memory arrays 100 or 105 has the row address in process. The command code 624 is determined (Box 635) if it an Address Ahead Read operation. If it is not an Address Ahead Read operation, the operation is ended. If the operation is an Address Ahead Read operation, the column address 640 for the location of the initial data to be read is received and decoded (Box 645). The current address pointer (not shown) within the parallel interface control circuit 110 of FIG. 2 is set to the decoded starting column address 640. After a delay, the first addressed data 652a is transferred (Box 655) from the selected NAND or NOR nonvolatile memory arrays 100 or 105 to the parallel interface Input/Output bus 75 of FIG. 2.

The read operation (Box 655) as described above is in progress with the chip enable signal CE# at the low state (logical "0") and the serial clock SCLK being transferred with a duty cycle of approximately 50%. The address pointer is incremented. The chip enable signal CE# is examined (Box 640) if it has been activated 662 when the serial clock SCLK is at a low level. If the chip enable signal CE# has not been activated 662, the special mode register and the chip enable signal CE# are examined (Box 675) to determine that the Address Ahead Read operation has ended and the selected NAND nonvolatile memory arrays 100 or NOR nonvolatile memory arrays 105 have exited the special mode. If Address Ahead Read operation has not ended, the output data 652b for the next incremented address is transferred (Box 655) to the parallel interface Input/Output bus 75.

This process continues for the reading of the data segments 652a, 652b, . . . , 652n of the first data output 650 until the chip enable signal CE# is found to be activated 662 and the clock signal SCK is at a low level when examined (Box 660). The new address 667 for the location of the second data to be read is received and decoded (Box 665). The current address pointer (not shown) within the parallel interface control circuit 110 of FIG. 2 is set (Box 670) to the decoded new address 667. After a delay time, the first addressed data segment 682a is transferred (Box 655) from the selected NAND or NOR nonvolatile memory arrays 100 or 105 to the parallel interface Input/Output bus 75 of FIG. 2. The address pointer is incremented. The chip enable signal CE# is examined (Box 660) if it has been activated 684 when the clock signal SCK is at a low level. If it has not been activated 684, the special mode register and the chip enable signal CE# are examined (Box 675) to determine that a read operation has ended. If read operation has not ended, the output data 682b for the next incremented address is transferred (Box 655) to the parallel interface Input/Output bus 75.

This process continues for the reading of the data segments 682a, 682b, . . . , 682n of the second data output 680 until the chip enable signal CE# is found to be activated 684 and the clock signal SCK is at a low level when examined (Box 660). The next new address 685 for the location of the third data to be read is received and decoded (Box 665). The current address pointer (not shown) within the parallel interface control circuit 110 of FIG. 2 is set (Box 670) to the decoded third address 690. After a delay time, the first addressed data segment 692a of the third address data 664 is transferred (Box 655) from the selected NAND or NOR nonvolatile memory arrays 100 or 105 to the parallel interface Input/Output bus 75 of FIG. 2.

The address pointer is incremented. The chip enable signal CE# is examined (Box 660) if it has been activated when the clock signal SCK is at a low level. If it has not been activated, the special mode register and the chip enable signal CE# are examined (Box 674) to determine that the Address Ahead Read operation has ended. If read operation has not ended, the output data 692b for the next incremented address is transferred (Box 655) to the parallel interface Input/Output bus 75.

This process continues for the reading of the data segments 692a, 692b, . . . , 692n of the third data output 690 until the special mode register is deactivated 695 and the chip enable signal CE# is found to be deactivated 697 when examined (Box 675). Any number of address jumps may occur until the special mode register is found to be deactivated 695 and the chip enable signal CE# is found to be deactivated 697 when examined (Box 675) to end the Address Ahead Read operation.

FIGS. 14a, 14b and 14c are a table of the operational modes of the multiple nonvolatile memory units 70a, 70b, . . . 70n of the nonvolatile memory device 10 of FIG. 1. The basic operational modes are:

1. a read from either the NAND memory array element 100 or a NOR memory array element 105 or one sub-array of the NAND memory array element 100 or a NOR memory array element 105 of FIG. 2, while writing to the other NAND memory array element 100 or a NOR memory array element 105 or the sub-array of the NAND memory array element 100 or a NOR memory array element 105.
2. a write to either the NAND memory array element 100 or a NOR memory array element 105 or one sub-array of the NAND memory array element 100 or a NOR memory array element 105 of FIG. 2, while read from the other NAND memory array element 100 or a NOR memory array element 105 or the sub-array of the NAND memory array element 100 or a NOR memory array element 105.
3. a read from either the NAND memory array element 100 or a NOR memory array element 105 or one sub-array of the NAND memory array element 100 or a NOR memory array element 105 of FIG. 2, while reading from the other NAND memory array element 100 or a NOR memory array element 105 or the sub-array of the NAND memory array element 100 or a NOR memory array element 105.
4. a write to either the NAND memory array element 100 or a NOR memory array element 105 or one sub-array of the NAND memory array element 100 or a NOR memory array element 105 of FIG. 2, while writing to other NAND memory array element 100 and a NOR memory array element 105 or the sub-array of the NAND memory array element 100 or a NOR memory array element 105.

It should be noted that the operational modes are also between the multiple nonvolatile memory units 70a, 70b, ... 70n as well as between the NAND memory array element 100 and a NOR memory array element 105 of each of the multiple nonvolatile memory units 70a, 70b, ... 70n or between the sub-arrays of each of the NAND memory array element 100 and a NOR memory array element 105.

The operational modes as shown are combinations of the command structures as above described and the internal processes that the multiple nonvolatile memory units 70a, 70b, ... 70n employ in performing the read, erase and program operations for the NAND memory array element 100 and a NOR memory array element 105 within each of the multiple nonvolatile memory units 70a, 70b, ... 70n. The column labeled Operational Mode represents the combinations of read and write operations and the wave forms of the signals of the serial communication interface 15. The column labeled the Figs. for Operation provides the figures that describe the command operations that are combined to create the operational modes. As an example to guide in the understanding of the table of FIGS. 14a, 14b, and 14c, in the operational mode read a NOR array while writing to a separate sub-array of the NOR array or to a NOR array in a separate multiple nonvolatile memory units 70a, 70b, ... 70n, the host electronic device 5 of FIG. 1 issues either an erase operation for a NOR array or sub-array as illustrated in FIG. 8 or a program of a NOR array or sub-array as illustrated in FIG. 9 followed by a NOR read as illustrated in FIG. 5b.

FIG. 5b represents the signal waveforms and timing for the NAND or NOR Read. FIG. 6b represents the signal waveforms and timing for the concurrent NAND and NOR Read. FIG. 7b represents the signal waveforms and timing for the NAND and NOR mixed Random Read. FIG. 8 represents the signal waveforms and timing for the NAND or NOR Erase. FIG. 9 represents the signal waveforms and timing for the NAND or NOR Program. FIG. 10 represents the signal waveforms and timing for the NAND or NOR Status Register Read. FIG. 11b represents the signal waveforms and timing for the Read Resume operation. FIG. 12b is a timing diagram for a Read Jump operation. FIG. 13b is a timing diagram for an Address Ahead Read.

The nonvolatile memory device 10 of FIG. 1 integrates multiple NAND and NOR nonvolatile memory units 70a, 70b, ... 70n into a single memory element for a hybrid user data, code data for a permanent memory and a cache storage of a temporary memory for electronic systems such as consumer devices for example the next generation mobile phones. The chip combines the extremely high-density fast random-access NOR, extremely high-density relatively slow serial-read NAND on one chip by using a unified low-cost NAND manufacturing process and cell. The nonvolatile memory device 10 uses synchronous serial communication interface 15 that provides a serial interface Input/Output bus 75 that is configurable to provide a variable data width from a single bit transmission to any number of parallel bits dependent upon restrictions of the number of terminals allowable on the physical structure (chip, module, board). The serial communication interface 15 supports a double edge read mode which allows the chip output data at the falling edge and rising edge of the clock signal SCK to double the read speed. The structure of the command set and the partitioning of the multiple nonvolatile memory units 70a, 70b, ... 70n permits concurrent reading and writing, as described in FIGS. 14a, 14b, and 14c, between the multiple nonvolatile memory units 70a, 70b, ... 70n, between the NAND memory array elements 100 and a NOR memory array elements 105 of FIG. 2 within each of the multiple nonvolatile memory units 70a, 70b, ... 70n, and between the sub-arrays of the NAND memory array element 100 and a NOR memory array element 105.

While this invention has been particularly shown and described with reference to the preferred embodiments thereof, it will be understood by those skilled in the art that various changes in form and details may be made without departing from the spirit and scope of the invention.

The invention claimed is:

1. A method for controlling a plurality of nonvolatile memory devices comprising:
    providing the plurality of nonvolatile memory devices wherein each of the nonvolatile memory devices comprises a plurality of nonvolatile memory arrays, wherein each of the plurality of nonvolatile memory arrays comprises independent address, control, status, and data control circuitry;
    communicating commands, address, and write data to each of the plurality of nonvolatile memory devices;
    receiving read data and device status from each of the plurality of nonvolatile memory devices;
    indicating with the control signals that a read operation at one location is to be interrupted;
    relocating the read operation to a second address;
    decoding the second address; and
    transferring the data of the second location subsequent to the data from the first location.

2. The method for controlling a plurality of nonvolatile memory devices of claim 1 wherein each of the plurality of nonvolatile memory arrays is a NAND array, NOR array, or other type of nonvolatile memory array.

3. The method for controlling a plurality of nonvolatile memory devices of claim 2 wherein each of the NOR arrays are a NAND like dual charge retaining transistor NOR flash nonvolatile memory array.

4. The method for controlling a plurality of nonvolatile memory devices of claim 1 further comprises:
    receiving a master clock signal, a chip enable signal, and a serial data signal by each of the plurality of nonvolatile memory devices from a serial data bus;
    capturing with the master clock signal the control signals received from the serial data bus;
    decoding the control signals to activate each of the plurality of nonvolatile memory devices; and
    determining the commands to be executed by each of the plurality of nonvolatile memory devices;
    transmitting the decoded commands for execution by the plurality of nonvolatile memory arrays; and
    receiving the data signals from the serial data bus for distribution to selected locations within the nonvolatile memory arrays identified by the address signals.

5. The method for controlling a plurality of nonvolatile memory devices of claim 4 further comprising:
    receiving the address signal from the serial data bus;
    decoding the address signal designating the location of the data to be read or written to selected locations within the nonvolatile memory arrays; and
    serializing and transmitting data signals concurrently read from selected locations of the plurality of nonvolatile memory arrays on the serial data bus.

6. The method for controlling a plurality of nonvolatile memory devices of claim 5 further comprising:
    indicating with the control signals that a read operation is to be executed by:
        receiving and decoding two separate addresses to define a row address and a column address within one of the plurality of nonvolatile memory arrays, transferring and latching one address of the two separate addresses defining the row directly to a row latching driver, and transferring and latching the other address of the two separate addresses defining the column address a column latching driver of the selected one of the plurality of nonvolatile memory arrays; and transferring the data located at the location designated by the two separate addresses to the serial data bus.

7. The method for controlling a plurality of nonvolatile memory devices of claim 6 further comprising:

dividing each of the nonvolatile memory arrays into a plurality of sub-arrays; and independently and concurrently reading from or writing to nonvolatile memory arrays into the plurality of sub-arrays.

8. The method for controlling a plurality of nonvolatile memory devices of claim 7 wherein receiving data signals by the sub-arrays from the serial data bus occurs concurrently with programming data to selected memory cells of the nonvolatile memory sub-array.

9. The method for controlling a plurality of nonvolatile memory devices of claim 1 wherein the commands include a write operation for the plurality of nonvolatile memory arrays wherein the write operation comprises a program operation and an erase operation.

10. The method for controlling a plurality of nonvolatile memory devices of claim 1 wherein the coding of the control signals define that some of the nonvolatile memory arrays are being read, others of the nonvolatile memory arrays are being erased and still others are being programmed.

* * * * *